(12) United States Patent
Doval et al.

(10) Patent No.: US 12,177,997 B2
(45) Date of Patent: Dec. 24, 2024

(54) FUNCTIONAL COVER WITH WIRELESS CONNECTION FOR RING WEARABLE

(71) Applicant: Oura Health Oy, Oulu (FI)

(72) Inventors: Jose Julio Doval, Escondido, CA (US); Avi Halpern, Escondido, CA (US); Gary Watts, Oceanside, CA (US); Jonathan Watson, San Diego, CA (US); Kirt Alan Winter, San Diego, CA (US); Teemu Juhani Haverinen, Espoo (FI)

(73) Assignee: Oura Health Oy, Oulu (FI)

( * ) Notice: Subject to any disclaimer, the term of this patent is extended or adjusted under 35 U.S.C. 154(b) by 0 days.

(21) Appl. No.: 17/855,090

(22) Filed: Jun. 30, 2022

(65) Prior Publication Data

US 2024/0008205 A1    Jan. 4, 2024

(51) Int. Cl.
| | | |
|---|---|---|
| G06F 3/038 | (2013.01) |
| A44C 9/00 | (2006.01) |
| G06F 3/0338 | (2013.01) |
| H02J 50/10 | (2016.01) |
| H04B 5/00 | (2024.01) |
| H04B 5/24 | (2024.01) |
| H04B 5/72 | (2024.01) |
| H04B 5/79 | (2024.01) |
| H05K 5/02 | (2006.01) |
| H05K 5/03 | (2006.01) |

(52) U.S. Cl.
CPC ............ *H05K 5/03* (2013.01); *A44C 9/0092* (2013.01); *H02J 50/10* (2016.02); *H04B 5/24* (2024.01); *H04B 5/72* (2024.01); *H04B 5/79* (2024.01); *H05K 5/0221* (2013.01)

(58) Field of Classification Search
None
See application file for complete search history.

(56) References Cited

U.S. PATENT DOCUMENTS

| | | | |
|---|---|---|---|
| 9,313,609 B2 * | 4/2016 | Prencipe | G06Q 10/10 |
| 9,690,387 B2 * | 6/2017 | Hatton | G06F 3/014 |
| 9,992,743 B2 * | 6/2018 | Yamaji | G08C 17/02 |
| 10,444,834 B2 * | 10/2019 | Vescovi | G06F 3/0346 |
| 10,627,902 B2 * | 4/2020 | Vescovi | G06F 3/0233 |
| 10,980,453 B2 * | 4/2021 | Wedekind | A61B 5/742 |
| 11,360,587 B1 * | 6/2022 | Wang | G06F 3/016 |

(Continued)

*Primary Examiner* — Tuan A Tran
(74) *Attorney, Agent, or Firm* — Holland & Hart LLP

(57) ABSTRACT

Methods, systems, and devices for a functional cover are described. A removable cover (e.g., a functional cover) for a wearable ring device (e.g., a ring wearable) may include one or more electrical components positioned at least partially within the removable cover. In some cases, the functional cover may wireless connect with the ring wearable. The removable cover may further include a first inductive component within the removable cover, where the first inductive component is configured to wirelessly communicate with a second inductive component of the wearable ring device when the removable cover is in a mounted state on the wearable ring device. The first inductive component of the removable cover may be configured to transfer electrical current, data, or both, between the one or more electrical components of the removable cover and one or more additional electrical components of the wearable ring device.

19 Claims, 8 Drawing Sheets

(56) References Cited

U.S. PATENT DOCUMENTS

| | | | | |
|---|---|---|---|---|
| 11,620,461 B2* | 4/2023 | Temkin | ................... | H04B 5/72 |
| | | | | 340/10.3 |
| 11,678,152 B2* | 6/2023 | Temkin | ................ | H04W 76/10 |
| | | | | 455/41.1 |
| 11,829,460 B2* | 11/2023 | Vargas | ................... | G06V 40/70 |
| 2003/0142065 A1* | 7/2003 | Pahlavan | ............. | G06F 3/0346 |
| | | | | 345/156 |
| 2016/0249815 A1* | 9/2016 | Freeman | ............... | A61B 5/1118 |
| | | | | 600/483 |
| 2017/0147033 A1* | 5/2017 | Pastorino | ............. | G06F 3/0362 |
| 2020/0241641 A1* | 7/2020 | Vescovi | ................ | G06F 21/31 |
| 2021/0361162 A1* | 11/2021 | Burnette | ............. | A61B 5/7275 |
| 2023/0037029 A1* | 2/2023 | Samardzija | ............ | H01Q 1/085 |

* cited by examiner

Unmounted State 505

Mounted State 545

FUNCTIONAL COVER WITH WIRELESS CONNECTION FOR RING WEARABLE

FIELD OF TECHNOLOGY

The following relates to wearable devices and data processing, including functional cover with wireless connection for ring wearable.

BACKGROUND

Some wearable devices may be configured to collect data from users, including temperature data, heart rate data, and the like. Wearable devices may be configured to provide information to the user based on the collected data. In some cases, a manufacturer of the wearable device update the wearable device, such as by adding additional functionality to the wearable device through software updates. However, in cases where additional functionality requires new and/or additional electrical components, users may be forced to upgrade to new models of the wearable device, which may be costly, inconvenient, and wasteful. As such, conventional techniques for updating functionality to a wearable device may be improved.

DETAILED DESCRIPTION

Figure 1:
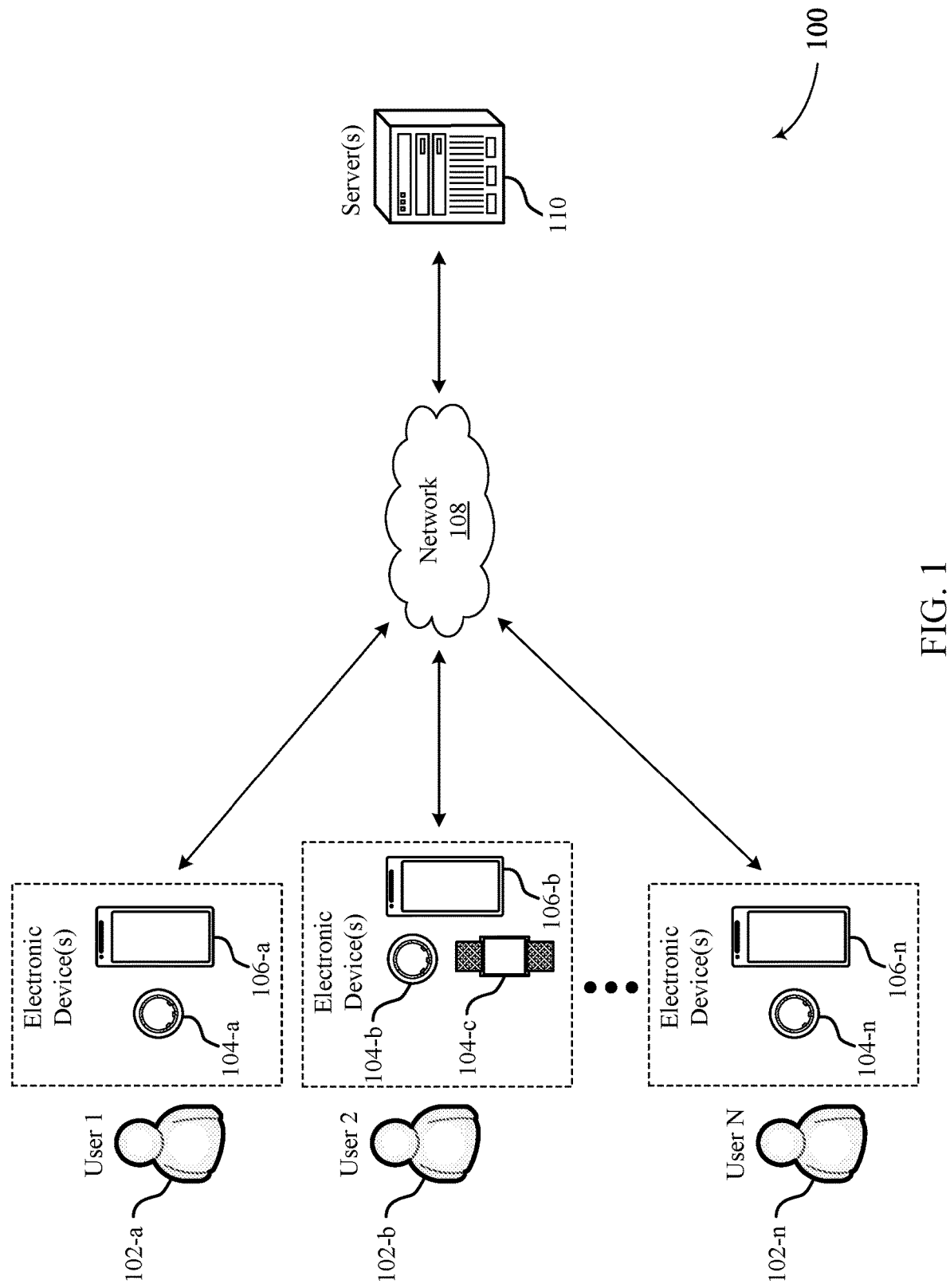
FIG. 1 illustrates an example of a system that supports functional covers with wireless connections for ring wearables in accordance with aspects of the present disclosure.

Some wearable devices may be configured to collect data from users associated with movement and other activities. For example, some wearable devices may be configured to acquire physiological data associated with a user including temperature data, heart rate data, and the like (e.g., data collection performed continuously, periodically, aperiodically). In some cases, a housing of a wearable device may store components that include device electronics, a power source (e.g., a battery), and electrical circuitry to interconnect the device electronics, the power source, or both. The device electronics may include one or more sensors configured to acquire physiological data from a user. The power source may store energy, and the electrical circuitry may distribute the stored energy to the device electronics, including the one or more sensors.

In some cases, the components of the wearable device may be anchored or otherwise attached to the wearable device such that one or more of the components are non-detachable or difficult to remove without causing damage to the wearable device. For instance, in some cases, the power source of the wearable device may be nondetachable by a user of the wearable device, meaning that the power source is not able to be removed without specialized tools, or without risking damage to the wearable device. In such cases, a user may be unable to swap the power source with a fully charged power source when the energy stored by the power source is depleted, for example. Instead, the user may remove the wearable device from being worn on their body to charge the wearable device such that the wearable device may be unable to acquire physiological data from the user while charging. Additionally, a battery module of an electronic device is frequently the module in a device that declines in performance most quickly (e.g., the battery module has a lower lifespan than most other modules of a device). Therefore, when a battery module fails or begins to a fail, a user may be forced to upgrade to a newer module of the wearable device even though the previous wearable device otherwise operated as intended. Similar situations may arise due to other module failures within the wearable device.

Moreover, as manufacturers continue to develop wearable devices, new features may be enabled. Some new features enabled by wearable devices may be implemented in software updates that do not require physical changes to the electrical components of the wearable device. However, other feature updates may require additional and/or new electrical and mechanical components, which typically result in users having to upgrade to newer models of the wearable device. Requiring users to continually purchase new models of wearable devices for each new feature may be costly, inconvenient, and wasteful. Moreover, in some cases, a user of a wearable device may desire additional functionalities for the wearable device, and may want to customize what data the wearable device is able to collect. However, the wearable device may be restricted to acquiring physiological data of the user in accordance with the one or more sensors protected by the housing of the wearable device. As such, conventional construction for wearable devices may be deficient for multiple reasons. For example, such an upgrade model for updating functionality of a device may be unsustainable such that it may incur a large environmental impact, a large cost impact to a user, etc.

Accordingly, to facilitate improved user experience for users of the wearable device, aspects of the present disclosure are directed to functional covers, functional modules, etc. (e.g., removable covers, removable modules, cover device) that may be attached to a wearable device to incorporate additional components and/or update existing functionality of the wearable device. In some implementations, the functional covers, modules, etc., for the wearable device may include electrical components that enable the functionality of the cover, communications with the wearable device, etc.

The removable, functional covers (e.g., modules) described herein may include a battery module that may replace or supplement an existing battery module of a wearable device. The removable cover may be a fitness tracker module, an air quality module, wireless communications module, location module, safety module, etc. In some cases, one or more of the removable covers may be stackable or otherwise combinable, such that multiple additional functionalities may be added to a wearable device. In some cases, a functional cover may provide multiple additional functionalities (e.g., a battery and an air quality module, an air quality module and a fitness tracker module). For example, in some cases, one or more functional covers may be added to a base wearable device (e.g., the wearable device without the removable cover) so as to allow a user to update the wearable device as the wearable devices ages, to add additional functionality to the wearable devices as the user's interests and/or needs associated with the wearable device change, etc. In some cases, the wearable device may be manufactured as a base module with basic functionality, where one or more functional covers may be added to the base module to update (e.g., personalize) the wireless device.

The wearable device may be configured with one or more electrical contacts to attach or couple to one or more functional covers. In some cases, the electrical contacts may be protected (e.g., hidden) by a removable cover. For example, if a user is satisfied with the base model, the user may keep the removable cover on the electrical contacts and use the wearable device with the base functionality. However, if the user wishes to upgrade the wearable device, the cover may be removed from the electrical contacts to attach a desired module to the wearable device.

In some aspects, the removable covers described herein may be configured to mechanically couple to a wearable device, where the electrical components of the removable cover may communicate electrical current and/or data with electrical components of the wearable device through electrical/physical contacts, through a wireless communication (e.g., inductive means), or both.

For example, a wearable ring device may be configured to be attachable with one or more removable covers, and one or more electrical components (e.g., antenna, battery, temperature sensor) may be positioned at least partially within a removable cover. In some cases, a first electrical contact component (e.g., mechanical contact, physical contact) may be exposed to an external surface of the removable cover. The first electrical contact component may be configured to physically and electrically contact a second electrical contact component of the wearable ring device when the removable cover is in a mounted state on the wearable ring device. Moreover, when the removable cover is in the mounted state, the first electrical component may also be configured to transfer electrical current, data, or both, between the one or more electrical components (e.g., sensors, battery) of the removable cover and one or more additional electrical components of the wearable ring device.

Comparatively, in additional or alternative implementations, the functional covers for the wearable device may include one or more inductive components. For example, in some implementations, both the wearable device (e.g., ring wearable) and the removable cover may include inductive components that enable a transfer of electrical current/power, data, or both, between components of the wearable device and components of the removable cover. In particular, the removable cover may be configured to attach to the wearable device such that the inductive component of the wearable device and the inductive component of the removable cover are able to interface with one another (e.g., inductive components aligned with one another) to enable the exchange of power, data, or both.

In some examples, the wearable device may include a locking mechanism to lock the removable cover into place, such that the electrical contacts, inductive components, etc., of the wearable device and the removable cover align, or are otherwise able to couple with one another. For example, a ring device (e.g., the wearable device without the removable cover) may include a first locking component and a removable cover may include a second locking component. In such examples, the first locking component may be configured to engage the second locking component to secure the removable cover to the wearable ring device in the mounted state.

Therefore, according to aspects of the present disclosure, a user of the wearable device may add and/or replace one or more functional covers (e.g., modules, components) of a wearable device to update the wearable device as the wearable devices ages (e.g., replace a battery module), to add additional functionality to the wearable devices as the user's interests and/or needs associated with the wearable device change, etc. By manufacturing removable, functional covers in such a way, a user (e.g., a consumer) may have added flexibility in customizing a wearable device that fits the user's needs, interests, etc. Further, the user may select one or more functional covers of interest to the user while refraining to use other functional covers not of interest to the user. Therefore, additional functionality may be added to the wearable device while mitigating the size, manufacturing complexity, etc. of a base wearable device. Updating and/or upgrading a wearable device in such a way may mitigate cost impact to the user as purchasing one or more functional covers may be more cost effective than purchasing a new model of the wearable device. Additionally, updating a wearable device in such a way may mitigate environmental impact.

Aspects of the disclosure are initially described in the context of systems supporting physiological data collection from users via wearable devices. Additional aspects of the disclosure are described in the context of example wearable device diagrams (e.g., wearable device systems) and locking mechanisms. Aspects of the disclosure are further illustrated by and described with reference to apparatus diagrams, system diagrams, and flowcharts that relate to functional covers with wireless connections for ring wearables.

FIG. 1 illustrates an example of a system 100 that supports functional covers with wireless connections for ring wearables in accordance with aspects of the present disclosure. The system 100 includes a plurality of electronic devices (e.g., wearable devices 104, user devices 106) that may be worn and/or operated by one or more users 102. The system 100 further includes a network 108 and one or more servers 110.

The electronic devices may include any electronic devices known in the art, including wearable devices 104 (e.g., ring wearable devices, watch wearable devices, etc.), user devices 106 (e.g., smartphones, laptops, tablets). The electronic devices associated with the respective users 102 may include one or more of the following functionalities: 1) measuring physiological data, 2) storing the measured data, 3) processing the data, 4) providing outputs (e.g., via GUIs) to a user 102 based on the processed data, and 5) communicating data with one another and/or other computing devices. Different electronic devices may perform one or more of the functionalities.

Example wearable devices 104 may include wearable computing devices, such as a ring computing device (hereinafter "ring") configured to be worn on a user's 102 finger, a wrist computing device (e.g., a smart watch, fitness band, or bracelet) configured to be worn on a user's 102 wrist, and/or a head mounted computing device (e.g., glasses/goggles). Wearable devices 104 may also include bands, straps (e.g., flexible or inflexible bands or straps), stick-on sensors, and the like, that may be positioned in other locations, such as bands around the head (e.g., a forehead headband), arm (e.g., a forearm band and/or bicep band), and/or leg (e.g., a thigh or calf band), behind the ear, under the armpit, and the like. Wearable devices 104 may also be attached to, or included in, articles of clothing. For example, wearable devices 104 may be included in pockets and/or pouches on clothing. As another example, wearable device 104 may be clipped and/or pinned to clothing, or may otherwise be maintained within the vicinity of the user 102. Example articles of clothing may include, but are not limited to, hats, shirts, gloves, pants, socks, outerwear (e.g., jackets), and undergarments. In some implementations, wearable devices 104 may be included with other types of devices such as training/sporting devices that are used during physical activity. For example, wearable devices 104 may be attached to, or included in, a bicycle, skis, a tennis racket, a golf club, and/or training weights.

Much of the present disclosure may be described in the context of a ring wearable device 104. Accordingly, the terms "ring 104," "wearable device 104," and like terms, may be used interchangeably, unless noted otherwise herein. However, the use of the term "ring 104" is not to be regarded as limiting, as it is contemplated herein that aspects of the present disclosure may be performed using other wearable devices (e.g., watch wearable devices, necklace wearable device, bracelet wearable devices, earring wearable devices, anklet wearable devices, and the like).

In some aspects, user devices 106 may include handheld mobile computing devices, such as smartphones and tablet computing devices. User devices 106 may also include personal computers, such as laptop and desktop computing devices. Other example user devices 106 may include server computing devices that may communicate with other electronic devices (e.g., via the Internet). In some implementations, computing devices may include medical devices, such as external wearable computing devices (e.g., Holter monitors). Medical devices may also include implantable medical devices, such as pacemakers and cardioverter defibrillators. Other example user devices 106 may include home computing devices, such as internet of things (IoT) devices (e.g., IoT devices), smart televisions, smart speakers, smart displays (e.g., video call displays), hubs (e.g., wireless communication hubs), security systems, smart appliances (e.g., thermostats and refrigerators), and fitness equipment.

Some electronic devices (e.g., wearable devices 104, user devices 106) may measure physiological parameters of respective users 102, such as photoplethysmography waveforms, continuous skin temperature, a pulse waveform, respiration rate, heart rate, heart rate variability (HRV), actigraphy, galvanic skin response, pulse oximetry, and/or other physiological parameters. Some electronic devices that measure physiological parameters may also perform some/all of the calculations described herein. Some electronic devices may not measure physiological parameters, but may perform some/all of the calculations described herein. For example, a ring (e.g., wearable device 104), mobile device application, or a server computing device may process received physiological data that was measured by other devices.

In some implementations, a user 102 may operate, or may be associated with, multiple electronic devices, some of which may measure physiological parameters and some of which may process the measured physiological parameters. In some implementations, a user 102 may have a ring (e.g., wearable device 104) that measures physiological parameters. The user 102 may also have, or be associated with, a user device 106 (e.g., mobile device, smartphone), where the wearable device 104 and the user device 106 are communicatively coupled to one another. In some cases, the user device 106 may receive data from the wearable device 104 and perform some/all of the calculations described herein. In some implementations, the user device 106 may also measure physiological parameters described herein, such as motion/activity parameters.

For example, as illustrated in FIG. 1, a first user 102-*a* (User 1) may operate, or may be associated with, a wearable device 104-*a* (e.g., ring 104-*a*) and a user device 106-*a* that may operate as described herein. In this example, the user device 106-*a* associated with user 102-*a* may process/store physiological parameters measured by the ring 104-*a*. Comparatively, a second user 102-*b* (User 2) may be associated with a ring 104-*b*, a watch wearable device 104-*c* (e.g., watch 104-*c*), and a user device 106-*b*, where the user device 106-*b* associated with user 102-*b* may process/store physiological parameters measured by the ring 104-*b* and/or the watch 104-*c*. Moreover, an nth user 102-*n* (User N) may be associated with an arrangement of electronic devices described herein (e.g., ring 104-*n*, user device 106-*n*). In some aspects, wearable devices 104 (e.g., rings 104, watches 104) and other electronic devices may be communicatively coupled to the user devices 106 of the respective users 102 via Bluetooth, Wi-Fi, and other wireless protocols.

In some implementations, the rings 104 (e.g., wearable devices 104) of the system 100 may be configured to collect physiological data from the respective users 102 based on arterial blood flow within the user's finger. In particular, a ring 104 may utilize one or more LEDs (e.g., red LEDs, green LEDs) that emit light on the palm-side of a user's finger to collect physiological data based on arterial blood flow within the user's finger. In some cases, the system 100 may be configured to collect physiological data from the respective users 102 based on blood flow diffused into a microvascular bed of skin with capillaries and arterioles. For example, the system 100 may collect PPG data based on a measured amount of blood diffused into the microvascular system of capillaries and arterioles. In some implementations, the ring 104 may acquire the physiological data using a combination of both green and red LEDs. The physiological data may include any physiological data known in the art including, but not limited to, temperature data, accelerometer data (e.g., movement/motion data), heart rate data, HRV data, blood oxygen level data, or any combination thereof.

The use of both green and red LEDs may provide several advantages over other solutions, as red and green LEDs have been found to have their own distinct advantages when acquiring physiological data under different conditions (e.g., light/dark, active/inactive) and via different parts of the body, and the like. For example, green LEDs have been found to exhibit better performance during exercise. Moreover, using multiple LEDs (e.g., green and red LEDs) distributed around the ring 104 has been found to exhibit superior performance as compared to wearable devices that utilize LEDs that are positioned close to one another, such as within a watch wearable device. Furthermore, the blood vessels in the finger (e.g., arteries, capillaries) are more accessible via LEDs as compared to blood vessels in the wrist. In particular, arteries in the wrist are positioned on the bottom of the wrist (e.g., palm-side of the wrist), meaning only capillaries are accessible on the top of the wrist (e.g., back of hand side of the wrist), where wearable watch devices and similar devices are typically worn. As such, utilizing LEDs and other sensors within a ring 104 has been found to exhibit superior performance as compared to wearable devices worn on the wrist, as the ring 104 may have greater access to arteries (as compared to capillaries), thereby resulting in stronger signals and more valuable physiological data.

The electronic devices of the system 100 (e.g., user devices 106, wearable devices 104) may be communicatively coupled to one or more servers 110 via wired or wireless communication protocols. For example, as shown in FIG. 1, the electronic devices (e.g., user devices 106) may be communicatively coupled to one or more servers 110 via a network 108. The network 108 may implement transfer control protocol and internet protocol (TCP/IP), such as the Internet, or may implement other network 108 protocols. Network connections between the network 108 and the respective electronic devices may facilitate transport of data via email, web, text messages, mail, or any other appropriate form of interaction within a computer network 108. For example, in some implementations, the ring 104-a associated with the first user 102-a may be communicatively coupled to the user device 106-a, where the user device 106-a is communicatively coupled to the servers 110 via the network 108. In additional or alternative cases, wearable devices 104 (e.g., rings 104, watches 104) may be directly communicatively coupled to the network 108.

The system 100 may offer an on-demand database service between the user devices 106 and the one or more servers 110. In some cases, the servers 110 may receive data from the user devices 106 via the network 108, and may store and analyze the data. Similarly, the servers 110 may provide data to the user devices 106 via the network 108. In some cases, the servers 110 may be located at one or more data centers. The servers 110 may be used for data storage, management, and processing. In some implementations, the servers 110 may provide a web-based interface to the user device 106 via web browsers.

In some aspects, the system 100 may detect periods of time that a user 102 is asleep, and classify periods of time that the user 102 is asleep into one or more sleep stages (e.g., sleep stage classification). For example, as shown in FIG. 1, User 102-a may be associated with a wearable device 104-a (e.g., ring 104-a) and a user device 106-a. In this example, the ring 104-a may collect physiological data associated with the user 102-a, including temperature, heart rate, HRV, respiratory rate, and the like. In some aspects, data collected by the ring 104-a may be input to a machine learning classifier, where the machine learning classifier is configured to determine periods of time that the user 102-a is (or was) asleep. Moreover, the machine learning classifier may be configured to classify periods of time into different sleep stages, including an awake sleep stage, a rapid eye movement (REM) sleep stage, a light sleep stage (non-REM (NREM)), and a deep sleep stage (NREM). In some aspects, the classified sleep stages may be displayed to the user 102-a via a GUI of the user device 106-a. Sleep stage classification may be used to provide feedback to a user 102-a regarding the user's sleeping patterns, such as recommended bedtimes, recommended wake-up times, and the like. Moreover, in some implementations, sleep stage classification techniques described herein may be used to calculate scores for the respective user, such as Sleep Scores, Readiness Scores, and the like.

In some aspects, the system 100 may utilize circadian rhythm-derived features to further improve physiological data collection, data processing procedures, and other techniques described herein. The term circadian rhythm may refer to a natural, internal process that regulates an individual's sleep-wake cycle, that repeats approximately every 24 hours. In this regard, techniques described herein may utilize circadian rhythm adjustment models to improve physiological data collection, analysis, and data processing. For example, a circadian rhythm adjustment model may be input into a machine learning classifier along with physiological data collected from the user 102-a via the wearable device 104-a. In this example, the circadian rhythm adjustment model may be configured to "weight," or adjust, physiological data collected throughout a user's natural, approximately 24-hour circadian rhythm. In some implementations, the system may initially start with a "baseline" circadian rhythm adjustment model, and may modify the baseline model using physiological data collected from each user 102 to generate tailored, individualized circadian rhythm adjustment models that are specific to each respective user 102.

In some aspects, the system 100 may utilize other biological rhythms to further improve physiological data collection, analysis, and processing by phase of these other rhythms. For example, if a weekly rhythm is detected within an individual's baseline data, then the model may be configured to adjust "weights" of data by day of the week. Biological rhythms that may require adjustment to the model by this method include: 1) ultradian (faster than a day rhythms, including sleep cycles in a sleep state, and oscillations from less than an hour to several hours periodicity in the measured physiological variables during wake state; 2) circadian rhythms; 3) non-endogenous daily rhythms shown to be imposed on top of circadian rhythms, as in work schedules; 4) weekly rhythms, or other artificial time periodicities exogenously imposed (e.g., in a hypothetical culture with 12 day "weeks", 12 day rhythms could be used); 5) multi-day ovarian rhythms in women and spermatogenesis rhythms in men; 6) lunar rhythms (relevant for individuals living with low or no artificial lights); and 7) seasonal rhythms.

The biological rhythms are not always stationary rhythms. For example, many women experience variability in ovarian cycle length across cycles, and ultradian rhythms are not expected to occur at exactly the same time or periodicity across days even within a user. As such, signal processing techniques sufficient to quantify the frequency composition while preserving temporal resolution of these rhythms in physiological data may be used to improve detection of these rhythms, to assign phase of each rhythm to each moment in time measured, and to thereby modify adjustment models and comparisons of time intervals. The biological rhythm-adjustment models and parameters can be added in linear or non-linear combinations as appropriate to more accurately capture the dynamic physiological baselines of an individual or group of individuals.

In some aspects, the respective devices of the system 100 may support techniques for a functional cover, functional module, etc., for a wearable ring device (e.g., wearable device 104). The functional cover, functional module, etc. may be attachable to and/or removable from a wearable device 104 and may incorporate additional and/or update existing functionality of the wearable device. For the purposes of the present disclosure, the terms "functional cover," "functional module," and like terms, may be used interchangeably to refer to a device or component that is configured to attach to a wearable device, and provide additional components or functionality for the wearable device.

For example, a functional cover may be added to a base wearable device 104 to allow a user to update the wearable device 104, to add additional functionality to the wearable device 104, etc. In some aspects, the functional cover may include a removable functional cover that may be quickly and easily attached and removed from the wearable device 104. The functional cover may include a battery module, a fitness tracker module, an air quality module, a wireless communications module, a location module, a safety module, a self-identification or authentication module (e.g., module to authenticate the user for purchases, entry to restricted locations), etc. In general, functional covers described herein may include any electrical components (e.g., sensors, batteries) configured to interface with electrical components of the wearable device.

In some aspects, the functional cover may include electrical components that enable the functionality of the cover. In some implementations, the functional cover and a ring device may each be configured with one or more electrical contact components, where the one or more electrical contact components may electrically and physically contact to allow for transfer of electrical current, data, or both, between electrical components of the functional cover and additional electrical components of the wearable ring device.

Additionally or alternatively, the functional cover and the ring device may each include one or more inductive components. For example, a first inductive component of the ring device and a second inductive component of the functional cover may be configured to wirelessly interface, allowing for the second inductive component of the functional cover to wirelessly couple one or more sensors of the wearable ring device with the electrical components of the functional cover.

It should be appreciated by a person skilled in the art that one or more aspects of the disclosure may be implemented in a system 100 to additionally or alternatively solve other problems than those described above. Furthermore, aspects of the disclosure may provide technical improvements to "conventional" systems or processes as described herein. However, the description and appended drawings only include example technical improvements resulting from implementing aspects of the disclosure, and accordingly do not represent all of the technical improvements provided within the scope of the claims.

Figure 2:
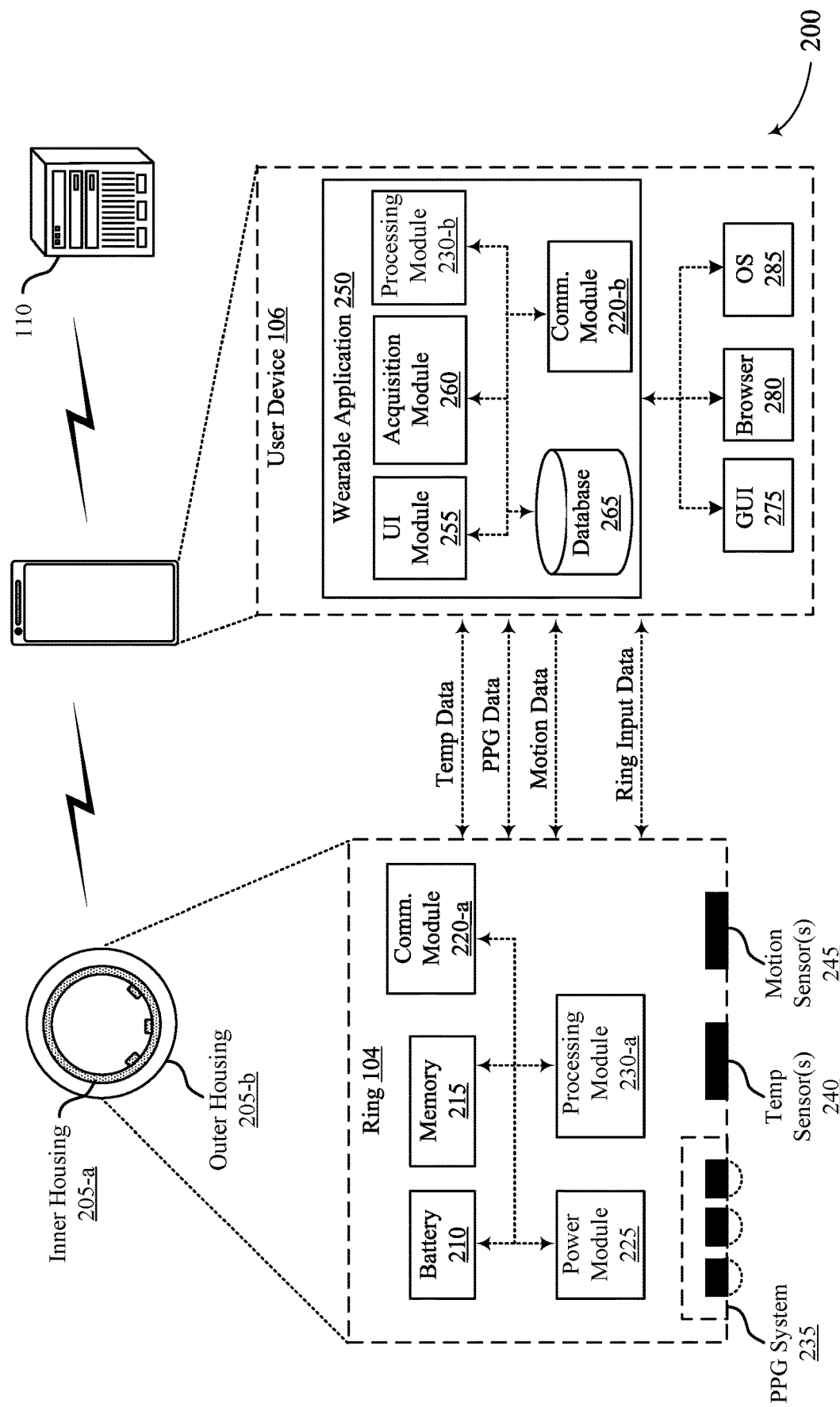
FIG. 2 illustrates an example of a system that supports functional covers with wireless connections for ring wearables in accordance with aspects of the present disclosure.

FIG. 2 illustrates an example of a system 200 that supports functional covers with wireless connections for ring wearables in accordance with aspects of the present disclosure. The system 200 may implement, or be implemented by, system 100. In particular, system 200 illustrates an example of a ring 104 (e.g., wearable device 104), a user device 106, and a server 110, as described with reference to FIG. 1.

In some aspects, the ring 104 may be configured to be worn around a user's finger, and may determine one or more user physiological parameters when worn around the user's finger. Example measurements and determinations may include, but are not limited to, user skin temperature, pulse waveforms, respiratory rate, heart rate, HRV, blood oxygen levels, and the like.

The system 200 further includes a user device 106 (e.g., a smartphone) in communication with the ring 104. For example, the ring 104 may be in wireless and/or wired communication with the user device 106. In some implementations, the ring 104 may send measured and processed data (e.g., temperature data, photoplethysmogram (PPG) data, motion/accelerometer data, ring input data, and the like) to the user device 106. The user device 106 may also send data to the ring 104, such as ring 104 firmware/configuration updates. The user device 106 may process data. In some implementations, the user device 106 may transmit data to the server 110 for processing and/or storage.

The ring 104 may include a housing 205 that may include an inner housing 205-a and an outer housing 205-b. In some aspects, the housing 205 of the ring 104 may store or otherwise include various components of the ring including, but not limited to, device electronics, a power source (e.g., battery 210, and/or capacitor), one or more substrates (e.g., printable circuit boards) that interconnect the device electronics and/or power source, and the like. The device electronics may include device modules (e.g., hardware/software), such as: a processing module 230-a, a memory 215, a communication module 220-a, a power module 225, and the like. The device electronics may also include one or more sensors. Example sensors may include one or more temperature sensors 240, a PPG sensor assembly (e.g., PPG system 235), and one or more motion sensors 245.

The sensors may include associated modules (not illustrated) configured to communicate with the respective components/modules of the ring 104, and generate signals associated with the respective sensors. In some aspects, each of the components/modules of the ring 104 may be communicatively coupled to one another via wired or wireless connections. Moreover, the ring 104 may include additional and/or alternative sensors or other components that are configured to collect physiological data from the user, including light sensors (e.g., LEDs), oximeters, and the like.

The ring 104 shown and described with reference to FIG. 2 is provided solely for illustrative purposes. As such, the ring 104 may include additional or alternative components as those illustrated in FIG. 2. Other rings 104 that provide functionality described herein may be fabricated. For example, rings 104 with fewer components (e.g., sensors) may be fabricated. In a specific example, a ring 104 with a single temperature sensor 240 (or other sensor), a power source, and device electronics configured to read the single temperature sensor 240 (or other sensor) may be fabricated. In another specific example, a temperature sensor 240 (or other sensor) may be attached to a user's finger (e.g., using a clamps, spring loaded clamps, etc.). In this case, the sensor may be wired to another computing device, such as a wrist worn computing device that reads the temperature sensor 240 (or other sensor). In other examples, a ring 104 that includes additional sensors and processing functionality may be fabricated.

The housing 205 may include one or more housing 205 components. The housing 205 may include an outer housing 205-b component (e.g., a shell) and an inner housing 205-a component (e.g., a molding). The housing 205 may include additional components (e.g., additional layers) not explicitly illustrated in FIG. 2. For example, in some implementations, the ring 104 may include one or more insulating layers that electrically insulate the device electronics and other conductive materials (e.g., electrical traces) from the outer housing 205-b (e.g., a metal outer housing 205-b). The housing 205 may provide structural support for the device electronics, battery 210, substrate(s), and other components. For example, the housing 205 may protect the device electronics, battery 210, and substrate(s) from mechanical forces, such as pressure and impacts. The housing 205 may also protect the device electronics, battery 210, and substrate(s) from water and/or other chemicals.

The outer housing 205-b may be fabricated from one or more materials. In some implementations, the outer housing 205-b may include a metal, such as titanium, that may provide strength and abrasion resistance at a relatively light weight. The outer housing 205-b may also be fabricated from other materials, such polymers. In some implementations, the outer housing 205-b may be protective as well as decorative.

The inner housing 205-a may be configured to interface with the user's finger. The inner housing 205-a may be formed from a polymer (e.g., a medical grade polymer) or other material. In some implementations, the inner housing 205-a may be transparent. For example, the inner housing 205-a may be transparent to light emitted by the PPG light emitting diodes (LEDs). In some implementations, the inner housing 205-a component may be molded onto the outer housing 205-a. For example, the inner housing 205-a may include a polymer that is molded (e.g., injection molded) to fit into an outer housing 205-b metallic shell.

The ring 104 may include one or more substrates (not illustrated). The device electronics and battery 210 may be included on the one or more substrates. For example, the device electronics and battery 210 may be mounted on one or more substrates. Example substrates may include one or more printed circuit boards (PCBs), such as flexible PCB (e.g., polyimide). In some implementations, the electronics/battery 210 may include surface mounted devices (e.g., surface-mount technology (SMT) devices) on a flexible PCB. In some implementations, the one or more substrates (e.g., one or more flexible PCBs) may include electrical traces that provide electrical communication between device electronics. The electrical traces may also connect the battery 210 to the device electronics.

The device electronics, battery 210, and substrates may be arranged in the ring 104 in a variety of ways. In some implementations, one substrate that includes device electronics may be mounted along the bottom of the ring 104 (e.g., the bottom half), such that the sensors (e.g., PPG system 235, temperature sensors 240, motion sensors 245, and other sensors) interface with the underside of the user's finger. In these implementations, the battery 210 may be included along the top portion of the ring 104 (e.g., on another substrate).

The various components/modules of the ring 104 represent functionality (e.g., circuits and other components) that may be included in the ring 104. Modules may include any discrete and/or integrated electronic circuit components that implement analog and/or digital circuits capable of producing the functions attributed to the modules herein. For example, the modules may include analog circuits (e.g., amplification circuits, filtering circuits, analog/digital conversion circuits, and/or other signal conditioning circuits). The modules may also include digital circuits (e.g., combinational or sequential logic circuits, memory circuits etc.).

The memory 215 (memory module) of the ring 104 may include any volatile, non-volatile, magnetic, or electrical media, such as a random access memory (RAM), read-only memory (ROM), non-volatile RAM (NVRAM), electrically-erasable programmable ROM (EEPROM), flash memory, or any other memory device. The memory 215 may store any of the data described herein. For example, the memory 215 may be configured to store data (e.g., motion data, temperature data, PPG data) collected by the respective sensors and PPG system 235. Furthermore, memory 215 may include instructions that, when executed by one or more processing circuits, cause the modules to perform various functions attributed to the modules herein. The device electronics of the ring 104 described herein are only example device electronics. As such, the types of electronic components used to implement the device electronics may vary based on design considerations.

The functions attributed to the modules of the ring 104 described herein may be embodied as one or more processors, hardware, firmware, software, or any combination thereof. Depiction of different features as modules is intended to highlight different functional aspects and does not necessarily imply that such modules must be realized by separate hardware/software components. Rather, functionality associated with one or more modules may be performed by separate hardware/software components or integrated within common hardware/software components.

The processing module 230-a of the ring 104 may include one or more processors (e.g., processing units), microcontrollers, digital signal processors, systems on a chip (SOCs), and/or other processing devices. The processing module 230-a communicates with the modules included in the ring 104. For example, the processing module 230-a may transmit/receive data to/from the modules and other components of the ring 104, such as the sensors. As described herein, the modules may be implemented by various circuit components. Accordingly, the modules may also be referred to as circuits (e.g., a communication circuit and power circuit).

The processing module 230-a may communicate with the memory 215. The memory 215 may include computer-readable instructions that, when executed by the processing module 230-a, cause the processing module 230-a to perform the various functions attributed to the processing module 230-a herein. In some implementations, the processing module 230-a (e.g., a microcontroller) may include additional features associated with other modules, such as communication functionality provided by the communication module 220-a (e.g., an integrated Bluetooth Low Energy transceiver) and/or additional onboard memory 215.

The communication module 220-a may include circuits that provide wireless and/or wired communication with the user device 106 (e.g., communication module 220-b of the user device 106). In some implementations, the communication modules 220-a, 220-b may include wireless communication circuits, such as Bluetooth circuits and/or Wi-Fi circuits. In some implementations, the communication modules 220-a, 220-b can include wired communication circuits, such as Universal Serial Bus (USB) communication circuits. Using the communication module 220-a, the ring 104 and the user device 106 may be configured to communicate with each other. The processing module 230-a of the ring may be configured to transmit/receive data to/from the user device 106 via the communication module 220-a. Example data may include, but is not limited to, motion data, temperature data, pulse waveforms, heart rate data, HRV data, PPG data, and status updates (e.g., charging status, battery charge level, and/or ring 104 configuration settings). The processing module 230-a of the ring may also be configured to receive updates (e.g., software/firmware updates) and data from the user device 106.

The ring 104 may include a battery 210 (e.g., a rechargeable battery 210). An example battery 210 may include a Lithium-Ion or Lithium-Polymer type battery 210, although a variety of battery 210 options are possible. The battery 210 may be wirelessly charged. In some implementations, the ring 104 may include a power source other than the battery 210, such as a capacitor. The power source (e.g., battery 210 or capacitor) may have a curved geometry that matches the curve of the ring 104. In some aspects, a charger or other power source may include additional sensors that may be used to collect data in addition to, or which supplements, data collected by the ring 104 itself. Moreover, a charger or other power source for the ring 104 may function as a user device 106, in which case the charger or other power source for the ring 104 may be configured to receive data from the ring 104, store and/or process data received from the ring 104, and communicate data between the ring 104 and the servers 110.

In some aspects, the ring 104 includes a power module 225 that may control charging of the battery 210. For example, the power module 225 may interface with an external wireless charger that charges the battery 210 when interfaced with the ring 104. The charger may include a datum structure that mates with a ring 104 datum structure to create a specified orientation with the ring 104 during 104 charging. The power module 225 may also regulate voltage(s) of the device electronics, regulate power output to the device electronics, and monitor the state of charge of the battery 210. In some implementations, the battery 210 may include a protection circuit module (PCM) that protects the battery 210 from high current discharge, over voltage during 104 charging, and under voltage during 104 discharge. The power module 225 may also include electro-static discharge (ESD) protection.

The one or more temperature sensors 240 may be electrically coupled to the processing module 230-a. The temperature sensor 240 may be configured to generate a temperature signal (e.g., temperature data) that indicates a temperature read or sensed by the temperature sensor 240. The processing module 230-a may determine a temperature of the user in the location of the temperature sensor 240. For example, in the ring 104, temperature data generated by the temperature sensor 240 may indicate a temperature of a user at the user's finger (e.g., skin temperature). In some implementations, the temperature sensor 240 may contact the user's skin. In other implementations, a portion of the housing 205 (e.g., the inner housing 205-a) may form a barrier (e.g., a thin, thermally conductive barrier) between the temperature sensor 240 and the user's skin. In some implementations, portions of the ring 104 configured to contact the user's finger may have thermally conductive portions and thermally insulative portions. The thermally conductive portions may conduct heat from the user's finger to the temperature sensors 240. The thermally insulative portions may insulate portions of the ring 104 (e.g., the temperature sensor 240) from ambient temperature.

In some implementations, the temperature sensor 240 may generate a digital signal (e.g., temperature data) that the processing module 230-a may use to determine the temperature. As another example, in cases where the temperature sensor 240 includes a passive sensor, the processing module 230-a (or a temperature sensor 240 module) may measure a current/voltage generated by the temperature sensor 240 and determine the temperature based on the measured current/voltage. Example temperature sensors 240 may include a thermistor, such as a negative temperature coefficient (NTC) thermistor, or other types of sensors including resistors, transistors, diodes, and/or other electrical/electronic components.

The processing module 230-a may sample the user's temperature over time. For example, the processing module 230-a may sample the user's temperature according to a sampling rate. An example sampling rate may include one sample per second, although the processing module 230-a may be configured to sample the temperature signal at other sampling rates that are higher or lower than one sample per second. In some implementations, the processing module 230-a may sample the user's temperature continuously throughout the day and night. Sampling at a sufficient rate (e.g., one sample per second) throughout the day may provide sufficient temperature data for analysis described herein.

The processing module 230-a may store the sampled temperature data in memory 215. In some implementations, the processing module 230-a may process the sampled temperature data. For example, the processing module 230-a may determine average temperature values over a period of time. In one example, the processing module 230-a may determine an average temperature value each minute by summing all temperature values collected over the minute and dividing by the number of samples over the minute. In a specific example where the temperature is sampled at one sample per second, the average temperature may be a sum of all sampled temperatures for one minute divided by sixty seconds. The memory 215 may store the average temperature values over time. In some implementations, the memory 215 may store average temperatures (e.g., one per minute) instead of sampled temperatures in order to conserve memory 215.

The sampling rate, which may be stored in memory 215, may be configurable. In some implementations, the sampling rate may be the same throughout the day and night. In other implementations, the sampling rate may be changed throughout the day/night. In some implementations, the ring 104 may filter/reject temperature readings, such as large spikes in temperature that are not indicative of physiological changes (e.g., a temperature spike from a hot shower). In some implementations, the ring 104 may filter/reject temperature readings that may not be reliable due to other factors, such as excessive motion during 104 exercise (e.g., as indicated by a motion sensor 245).

The ring 104 (e.g., communication module) may transmit the sampled and/or average temperature data to the user device 106 for storage and/or further processing. The user device 106 may transfer the sampled and/or average temperature data to the server 110 for storage and/or further processing.

Although the ring 104 is illustrated as including a single temperature sensor 240, the ring 104 may include multiple temperature sensors 240 in one or more locations, such as arranged along the inner housing 205-a near the user's finger. In some implementations, the temperature sensors 240 may be stand-alone temperature sensors 240. Additionally, or alternatively, one or more temperature sensors 240 may be included with other components (e.g., packaged with other components), such as with the accelerometer and/or processor.

The processing module 230-a may acquire and process data from multiple temperature sensors 240 in a similar manner described with respect to a single temperature sensor 240. For example, the processing module 230 may individually sample, average, and store temperature data from each of the multiple temperature sensors 240. In other examples, the processing module 230-a may sample the sensors at different rates and average/store different values for the different sensors. In some implementations, the processing module 230-a may be configured to determine a single temperature based on the average of two or more temperatures determined by two or more temperature sensors 240 in different locations on the finger.

The temperature sensors 240 on the ring 104 may acquire distal temperatures at the user's finger (e.g., any finger). For example, one or more temperature sensors 240 on the ring 104 may acquire a user's temperature from the underside of a finger or at a different location on the finger. In some implementations, the ring 104 may continuously acquire distal temperature (e.g., at a sampling rate). Although distal temperature measured by a ring 104 at the finger is described herein, other devices may measure temperature at the same/different locations. In some cases, the distal temperature measured at a user's finger may differ from the temperature measured at a user's wrist or other external body location. Additionally, the distal temperature measured at a user's finger (e.g., a "shell" temperature) may differ from the user's core temperature. As such, the ring 104 may provide a useful temperature signal that may not be acquired at other internal/external locations of the body. In some cases, continuous temperature measurement at the finger may capture temperature fluctuations (e.g., small or large fluctuations) that may not be evident in core temperature. For example, continuous temperature measurement at the finger may capture minute-to-minute or hour-to-hour temperature fluctuations that provide additional insight that may not be provided by other temperature measurements elsewhere in the body.

The ring 104 may include a PPG system 235. The PPG system 235 may include one or more optical transmitters that transmit light. The PPG system 235 may also include one or more optical receivers that receive light transmitted by the one or more optical transmitters. An optical receiver may generate a signal (hereinafter "PPG" signal) that indicates an amount of light received by the optical receiver. The optical transmitters may illuminate a region of the user's finger. The PPG signal generated by the PPG system 235 may indicate the perfusion of blood in the illuminated region. For example, the PPG signal may indicate blood volume changes in the illuminated region caused by a user's pulse pressure. The processing module 230-a may sample the PPG signal and determine a user's pulse waveform based on the PPG signal. The processing module 230-a may determine a variety of physiological parameters based on the user's pulse waveform, such as a user's respiratory rate, heart rate, HRV, oxygen saturation, and other circulatory parameters.

In some implementations, the PPG system 235 may be configured as a reflective PPG system 235 where the optical receiver(s) receive transmitted light that is reflected through the region of the user's finger. In some implementations, the PPG system 235 may be configured as a transmissive PPG system 235 where the optical transmitter(s) and optical receiver(s) are arranged opposite to one another, such that light is transmitted directly through a portion of the user's finger to the optical receiver(s).

The number and ratio of transmitters and receivers included in the PPG system 235 may vary. Example optical transmitters may include light-emitting diodes (LEDs). The optical transmitters may transmit light in the infrared spectrum and/or other spectrums. Example optical receivers may include, but are not limited to, photosensors, phototransistors, and photodiodes. The optical receivers may be configured to generate PPG signals in response to the wavelengths received from the optical transmitters. The location of the transmitters and receivers may vary. Additionally, a single device may include reflective and/or transmissive PPG systems 235.

The PPG system 235 illustrated in FIG. 2 may include a reflective PPG system 235 in some implementations. In these implementations, the PPG system 235 may include a centrally located optical receiver (e.g., at the bottom of the ring 104) and two optical transmitters located on each side of the optical receiver. In this implementation, the PPG system 235 (e.g., optical receiver) may generate the PPG signal based on light received from one or both of the optical transmitters. In other implementations, other placements, combinations, and/or configurations of one or more optical transmitters and/or optical receivers are contemplated.

The processing module 230-a may control one or both of the optical transmitters to transmit light while sampling the PPG signal generated by the optical receiver. In some implementations, the processing module 230-a may cause the optical transmitter with the stronger received signal to transmit light while sampling the PPG signal generated by the optical receiver. For example, the selected optical transmitter may continuously emit light while the PPG signal is sampled at a sampling rate (e.g., 250 Hz).

Sampling the PPG signal generated by the PPG system 235 may result in a pulse waveform that may be referred to as a "PPG." The pulse waveform may indicate blood pressure vs time for multiple cardiac cycles. The pulse waveform may include peaks that indicate cardiac cycles. Additionally, the pulse waveform may include respiratory induced variations that may be used to determine respiration rate. The processing module 230-a may store the pulse waveform in memory 215 in some implementations. The processing module 230-a may process the pulse waveform as it is generated and/or from memory 215 to determine user physiological parameters described herein.

The processing module 230-a may determine the user's heart rate based on the pulse waveform. For example, the processing module 230-a may determine heart rate (e.g., in beats per minute) based on the time between peaks in the pulse waveform. The time between peaks may be referred to as an interbeat interval (IBI). The processing module 230-a may store the determined heart rate values and IBI values in memory 215.

The processing module 230-a may determine HRV over time. For example, the processing module 230-a may determine HRV based on the variation in the IBIs. The processing module 230-a may store the HRV values over time in the memory 215. Moreover, the processing module 230-a may determine the user's respiratory rate over time. For example, the processing module 230-a may determine respiratory rate based on frequency modulation, amplitude modulation, or baseline modulation of the user's IBI values over a period of time. Respiratory rate may be calculated in breaths per minute or as another breathing rate (e.g., breaths per 30 seconds). The processing module 230-a may store user respiratory rate values over time in the memory 215.

The ring 104 may include one or more motion sensors 245, such as one or more accelerometers (e.g., 6-D accelerometers) and/or one or more gyroscopes (gyros). The motion sensors 245 may generate motion signals that indicate motion of the sensors. For example, the ring 104 may include one or more accelerometers that generate acceleration signals that indicate acceleration of the accelerometers. As another example, the ring 104 may include one or more gyro sensors that generate gyro signals that indicate angular motion (e.g., angular velocity) and/or changes in orientation. The motion sensors 245 may be included in one or more sensor packages. An example accelerometer/gyro sensor is a Bosch BMI160 inertial micro electro-mechanical system (MEMS) sensor that may measure angular rates and accelerations in three perpendicular axes.

The processing module 230-a may sample the motion signals at a sampling rate (e.g., 50 Hz) and determine the motion of the ring 104 based on the sampled motion signals. For example, the processing module 230-a may sample acceleration signals to determine acceleration of the ring 104. As another example, the processing module 230-a may sample a gyro signal to determine angular motion. In some implementations, the processing module 230-a may store motion data in memory 215. Motion data may include sampled motion data as well as motion data that is calculated based on the sampled motion signals (e.g., acceleration and angular values).

The ring 104 may store a variety of data described herein. For example, the ring 104 may store temperature data, such as raw sampled temperature data and calculated temperature data (e.g., average temperatures). As another example, the ring 104 may store PPG signal data, such as pulse waveforms and data calculated based on the pulse waveforms (e.g., heart rate values, IBI values, HRV values, and respiratory rate values). The ring 104 may also store motion data, such as sampled motion data that indicates linear and angular motion.

The ring 104, or other computing device, may calculate and store additional values based on the sampled/calculated physiological data. For example, the processing module 230 may calculate and store various metrics, such as sleep metrics (e.g., a Sleep Score), activity metrics, and readiness metrics. In some implementations, additional values/metrics may be referred to as "derived values." The ring 104, or other computing/wearable device, may calculate a variety of values/metrics with respect to motion. Example derived values for motion data may include, but are not limited to, motion count values, regularity values, intensity values, metabolic equivalence of task values (METs), and orientation values. Motion counts, regularity values, intensity values, and METs may indicate an amount of user motion (e.g., velocity/acceleration) over time. Orientation values may indicate how the ring 104 is oriented on the user's finger and if the ring 104 is worn on the left hand or right hand.

In some implementations, motion counts and regularity values may be determined by counting a number of acceleration peaks within one or more periods of time (e.g., one or more 30 second to 1 minute periods). Intensity values may indicate a number of movements and the associated intensity (e.g., acceleration values) of the movements. The intensity values may be categorized as low, medium, and high, depending on associated threshold acceleration values. METs may be determined based on the intensity of movements during a period of time (e.g., 30 seconds), the regularity/irregularity of the movements, and the number of movements associated with the different intensities.

In some implementations, the processing module 230-a may compress the data stored in memory 215. For example, the processing module 230-a may delete sampled data after making calculations based on the sampled data. As another example, the processing module 230-a may average data over longer periods of time in order to reduce the number of stored values. In a specific example, if average temperatures for a user over one minute are stored in memory 215, the processing module 230-a may calculate average temperatures over a five minute time period for storage, and then subsequently erase the one minute average temperature data. The processing module 230-a may compress data based on a variety of factors, such as the total amount of used/available memory 215 and/or an elapsed time since the ring 104 last transmitted the data to the user device 106.

Although a user's physiological parameters may be measured by sensors included on a ring 104, other devices may measure a user's physiological parameters. For example, although a user's temperature may be measured by a temperature sensor 240 included in a ring 104, other devices may measure a user's temperature. In some examples, other wearable devices (e.g., wrist devices) may include sensors that measure user physiological parameters. Additionally, medical devices, such as external medical devices (e.g., wearable medical devices) and/or implantable medical devices, may measure a user's physiological parameters. One or more sensors on any type of computing device may be used to implement the techniques described herein.

The physiological measurements may be taken continuously throughout the day and/or night. In some implementations, the physiological measurements may be taken during 104 portions of the day and/or portions of the night. In some implementations, the physiological measurements may be taken in response to determining that the user is in a specific state, such as an active state, resting state, and/or a sleeping state. For example, the ring 104 can make physiological measurements in a resting/sleep state in order to acquire cleaner physiological signals. In one example, the ring 104 or other device/system may detect when a user is resting and/or sleeping and acquire physiological parameters (e.g., temperature) for that detected state. The devices/systems may use the resting/sleep physiological data and/or other data when the user is in other states in order to implement the techniques of the present disclosure.

In some implementations, as described previously herein, the ring 104 may be configured to collect, store, and/or process data, and may transfer any of the data described herein to the user device 106 for storage and/or processing. In some aspects, the user device 106 includes a wearable application 250, an operating system (OS), a web browser application (e.g., web browser 280), one or more additional applications, and a GUI 275. The user device 106 may further include other modules and components, including sensors, audio devices, haptic feedback devices, and the like. The wearable application 250 may include an example of an application (e.g., "app") that may be installed on the user device 106. The wearable application 250 may be configured to acquire data from the ring 104, store the acquired data, and process the acquired data as described herein. For example, the wearable application 250 may include a user interface (UI) module 255, an acquisition module 260, a processing module 230-b, a communication module 220-b, and a storage module (e.g., database 265) configured to store application data.

The various data processing operations described herein may be performed by the ring 104, the user device 106, the servers 110, or any combination thereof. For example, in some cases, data collected by the ring 104 may be pre-processed and transmitted to the user device 106. In this example, the user device 106 may perform some data processing operations on the received data, may transmit the data to the servers 110 for data processing, or both. For instance, in some cases, the user device 106 may perform processing operations that require relatively low processing power and/or operations that require a relatively low latency, whereas the user device 106 may transmit the data to the servers 110 for processing operations that require relatively high processing power and/or operations that may allow relatively higher latency.

In some aspects, the ring 104, user device 106, and server 110 of the system 200 may be configured to evaluate sleep patterns for a user. In particular, the respective components of the system 200 may be used to collect data from a user via the ring 104, and generate one or more scores (e.g., Sleep Score, Readiness Score) for the user based on the collected data. For example, as noted previously herein, the ring 104 of the system 200 may be worn by a user to collect data from the user, including temperature, heart rate, HRV, and the like. Data collected by the ring 104 may be used to determine when the user is asleep in order to evaluate the user's sleep for a given "sleep day." In some aspects, scores may be calculated for the user for each respective sleep day, such that a first sleep day is associated with a first set of scores, and a second sleep day is associated with a second set of scores. Scores may be calculated for each respective sleep day based on data collected by the ring 104 during the respective sleep day. Scores may include, but are not limited to, Sleep Scores, Readiness Scores, and the like.

In some cases, "sleep days" may align with the traditional calendar days, such that a given sleep day runs from midnight to midnight of the respective calendar day. In other cases, sleep days may be offset relative to calendar days. For example, sleep days may run from 6:00 pm (18:00) of a calendar day until 6:00 pm (18:00) of the subsequent calendar day. In this example, 6:00 pm may serve as a "cut-off time," where data collected from the user before 6:00 pm is counted for the current sleep day, and data collected from the user after 6:00 pm is counted for the subsequent sleep day. Due to the fact that most individuals sleep the most at night, offsetting sleep days relative to calendar days may enable the system 200 to evaluate sleep patterns for users in such a manner that is consistent with their sleep schedules. In some cases, users may be able to selectively adjust (e.g., via the GUI) a timing of sleep days relative to calendar days so that the sleep days are aligned with the duration of time that the respective users typically sleep.

In some implementations, each overall score for a user for each respective day (e.g., Sleep Score, Readiness Score) may be determined/calculated based on one or more "contributors," "factors," or "contributing factors." For example, a user's overall Sleep Score may be calculated based on a set of contributors, including: total sleep, efficiency, restfulness, REM sleep, deep sleep, latency, timing, or any combination thereof. The Sleep Score may include any quantity of contributors. The "total sleep" contributor may refer to the sum of all sleep periods of the sleep day. The "efficiency" contributor may reflect the percentage of time spent asleep compared to time spent awake while in bed, and may be calculated using the efficiency average of long sleep periods (e.g., primary sleep period) of the sleep day, weighted by a duration of each sleep period. The "restfulness" contributor may indicate how restful the user's sleep is, and may be calculated using the average of all sleep periods of the sleep day, weighted by a duration of each period. The restfulness contributor may be based on a "wake up count" (e.g., sum of all the wake-ups (when user wakes up) detected during different sleep periods), excessive movement, and a "got up count" (e.g., sum of all the got-ups (when user gets out of bed) detected during the different sleep periods).

The "REM sleep" contributor may refer to a sum total of REM sleep durations across all sleep periods of the sleep day including REM sleep. Similarly, the "deep sleep" contributor may refer to a sum total of deep sleep durations across all sleep periods of the sleep day including deep sleep. The "latency" contributor may signify how long (e.g., average, median, longest) the user takes to go to sleep, and may be calculated using the average of long sleep periods throughout the sleep day, weighted by a duration of each period and the number of such periods (e.g., consolidation of a given sleep stage or sleep stages may be its own contributor or weight other contributors). Lastly, the "timing" contributor may refer to a relative timing of sleep periods within the sleep day and/or calendar day, and may be calculated using the average of all sleep periods of the sleep day, weighted by a duration of each period.

By way of another example, a user's overall Readiness Score may be calculated based on a set of contributors, including: sleep, sleep balance, heart rate, HRV balance, recovery index, temperature, activity, activity balance, or any combination thereof. The Readiness Score may include any quantity of contributors. The "sleep" contributor may refer to the combined Sleep Score of all sleep periods within the sleep day. The "sleep balance" contributor may refer to a cumulative duration of all sleep periods within the sleep day. In particular, sleep balance may indicate to a user whether the sleep that the user has been getting over some duration of time (e.g., the past two weeks) is in balance with the user's needs. Typically, adults need 7-9 hours of sleep a night to stay healthy, alert, and to perform at their best both mentally and physically. However, it is normal to have an occasional night of bad sleep, so the sleep balance contributor takes into account long-term sleep patterns to determine whether each user's sleep needs are being met. The "resting heart rate" contributor may indicate a lowest heart rate from the longest sleep period of the sleep day (e.g., primary sleep period) and/or the lowest heart rate from naps occurring after the primary sleep period.

Continuing with reference to the "contributors" (e.g., factors, contributing factors) of the Readiness Score, the "HRV balance" contributor may indicate a highest HRV average from the primary sleep period and the naps happening after the primary sleep period. The HRV balance contributor may help users keep track of their recovery status by comparing their HRV trend over a first time period (e.g., two weeks) to an average HRV over some second, longer time period (e.g., three months). The "recovery index" contributor may be calculated based on the longest sleep period. Recovery index measures how long it takes for a user's resting heart rate to stabilize during the night. A sign of a very good recovery is that the user's resting heart rate stabilizes during the first half of the night, at least six hours before the user wakes up, leaving the body time to recover for the next day. The "body temperature" contributor may be calculated based on the longest sleep period (e.g., primary sleep period) or based on a nap happening after the longest sleep period if the user's highest temperature during the nap is at least 0.5° C. higher than the highest temperature during the longest period. In some aspects, the ring may measure a user's body temperature while the user is asleep, and the system 200 may display the user's average temperature relative to the user's baseline temperature. If a user's body temperature is outside of their normal range (e.g., clearly above or below 0.0), the body temperature contributor may be highlighted (e.g., go to a "Pay attention" state) or otherwise generate an alert for the user.

In some aspects, the system 200 may support a wearable device that is configured to be attachable to one or more functional covers (e.g., cover devices, removable covers, modules, components, etc.) for the wearable device. In particular, techniques described herein support a ring 104, such as a wearable device 104 as described with reference to FIG. 1. For example, a ring 104 may include an inner housing 205-a configured to house one or more sensors and configured to acquire physiological data from a user 102 and an outer housing 205-b configured to house the inner housing 205-a. The one or more sensors of the ring 104 may obtain physiological measurements from the user (e.g., temperature sensors, additional LED-PD sensors used for measuring heart rate, oxygen saturation, one or more sensors that a device may use to detect whether a user is asleep, or the like). In some cases, the one or more sensors of the ring 104 are configured to acquire the physiological data from the user based on arterial blood flow, temperature, etc. In some implementations, the one or more sensors of the ring 104 are configured to acquire the physiological data (e.g., including PPG data) from the user based on blood flow that is diffused into the microvascular bed of skin with capillaries and arterioles. The one or more sensors of the ring 104 may be an example of photodetectors from the PPG system 235, temperature sensors 240, motion sensors 245, and other sensors.

As described herein, the wearable device of the system 200 may be configured to be attachable to one or more functional covers that contains one or more electrical components (e.g., antennas, a battery, sensors). The functional cover may enable the wearable device to support additional functions based on the connection between the one or more electrical components included in the functional cover and the one or more electrical components included in the ring 104. In some implementations, the electrical components of the functional cover and the electrical components of the ring 104 may transfer electrical current and/or data to one another based on at least one physical and electrical contact connection between the functional cover and the ring 104. In other examples, the electrical components of the functional cover and the electrical components of the ring 104 may transfer electrical current and/or data to one another based on a first inductive component of the functional cover being configured to wirelessly communicate with a second inductive component of the ring 104. In some cases, the electrical components of the functional cover and the electrical components of the ring 104 may transfer electrical current and/or data to one another using one or more inductive components, one or more electrical contacts, or both.

While much of the present disclosure describes one or more components of a functional cover in the context of a wearable ring device, aspects of the present disclosure may additionally or alternatively be implemented in the context of other wearable devices. For example, in some implementations, the one or more components of the functional cover described herein may be implemented in the context of other wearable devices, such as bracelets, watches, necklaces, piercings, and the like. For example, the wearable device 104 may surround a finger, wrist, ankle, or the like of a user.

Figure 3:
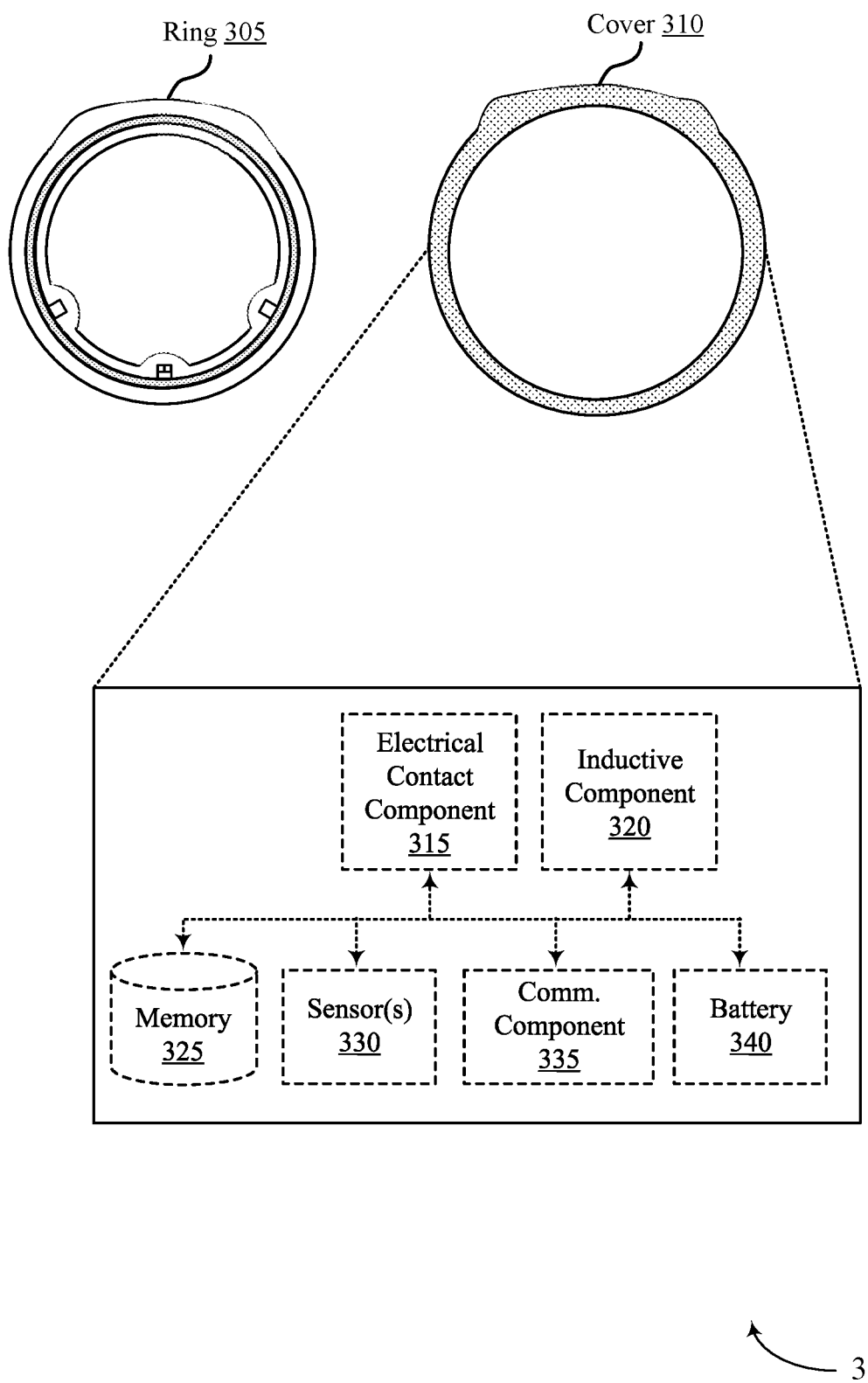
FIG. 3 illustrates an example of a wearable device diagram that supports functional covers with wireless connections for ring wearables in accordance with aspects of the present disclosure.

FIG. 3 illustrates an example of a wearable device diagram 300 that supports functional covers with wireless connections for ring wearables in accordance with aspects of the present disclosure. The wearable device diagram 300 may implement, or be implemented by, aspects of the system 100, system 200, or both. For example, wearable device diagram 300 may illustrate examples of wearable devices 104 as described with reference to FIG. 1. Although the wearable device is illustrated as a ring in FIG. 3, it may be any example of any type of wearable device (e.g., a watch, a necklace, and the like).

The wearable device in wearable device diagram 300 may include a ring 305 and a cover 310. The cover 310 may include an attachable cover (e.g., cover device, removable cover, module, component, etc.) that is associated with the ring 305. The wearable device diagram 300 illustrates the cover 310 in an unmounted state (e.g., the cover 310 is not attached to or engaged with the ring 305). In some aspects, the cover 310 may be removably attached to the ring 305 in a mounted state. In some examples, the cover 310 may function in coordination with the ring 305 based on whether the cover 310 is in the mounted state on the ring 305. In particular, as will be described in further detail herein, electrical components of the cover 310 may be configured to communicate with or interface with electrical components of the ring 305 when the cover 310 is in the mounted state.

The ring 305 may include a circumferential housing that includes an inner housing and an outer housing, which may be examples of an inner housing 205-*a* and an outer housing 205-*b* as described with reference to FIG. 2. The ring 305 in the wearable device diagram 300 may include an electronic substrate, such as a printed wiring board (PWB) or PCB. The PWB may have both flexible and rigid sections. Electrical components may be embedded in the electronic substrate of the ring 305. The electrical components of the ring 305 may include one or more sensors (e.g., temperature sensors, light sources) configured to acquire physiological data associated with the user. The one or more sensors of the ring 305 may be positioned at least partially within the circumferential housing of the ring 305.

The cover 310 may include a housing. In some examples, the housing of the cover 310 may be a ring-shaped housing. Additionally or alternatively, the housing of the cover 310 may be a block-shaped housing, or some other shaped housing. When the cover 310 is in the mounted state on the ring 305, the housing of the cover 310 may at least partially cover the external surface of the outer circumference of the ring 305. That is, in some cases, the cover 310 may be mounted or attached to an outer circumferential surface of the ring 305. Additionally or alternatively, when the cover 310 is in the mounted state, the housing of the cover 310 may at least partially cover the external surface of the inner circumference of the ring 305. That is, in some cases, the cover 310 may be mounted or attached to an inner circumferential surface of the ring 305. For example, a ring-shaped housing of the cover 310 may at least partially surround the ring 305 when the cover 310 is in the mounted state.

While the cover 310 is shown as an approximately circumferential cover, this is not to be regarded as a limitation of the present disclosure, unless noted otherwise herein. In particular, the cover 310 may be formed in any shape that may or may not exhibit a circumferential shape. For example, in some cases, the cover 310 may be designed as a box, sphere, or other decorative shape that is attached to the ring 305. For instance, in some cases, the cover 310 may include a block-shaped or sphere-shaped module that may be attached to a surface of the ring 305 (e.g., similar to a diamond on a wedding band) such that cover 310 at least partially covers the ring 305 when the cover 310 is in the mounted state.

The cover 305 may include components that are configured to interface with the ring 305, collect data, etc. For example, as shown in FIG. 3, the cover 310 may include, but is not limited to, an electrical contact component 315, an inductive component 320, a memory 235, one or more sensors 330, a communication component 335, and a battery 340.

In some examples, the ring 305 and the cover 310 may include electrical contact component(s) 315. For example, the cover 310 may include a first electrical contact component 315, and the ring 305 may include a second electrical contact component 315. The first electrical contact component 315 may be exposed to an external surface of the cover 310. Additionally, the second electrical contact component 315 may be exposed to an external surface of the ring 305. When the cover 310 is in the mounted state on the ring 305, the first electrical contact component 315 may be positioned such that the first electrical contact component 315 physically and electrically contacts the second electrical contact component 315 of the ring 305. In some aspects, the first and second electrical contact components 315 may be configured to transfer electrical current, data, or both, between the one or more electrical components of the cover 310 and one or more additional electrical components (e.g., one or more sensors included in the PWB) of the ring 305 when the cover 310 is in the mounted state on the ring 305.

In some other examples, the ring 305 and the cover 310 may include inductive component(s) 320. For example, the ring 305 may include a first inductive component 320, and the cover 310 may include a second inductive component 320. In some aspects, the inductive components 320 may include a transmitter coil, a receiver coil, ferrite tape, or a combination thereof. Inductive components of the ring 305 and the inductive components 320 of the cover 310 may wirelessly communicate so that one or more electrical components of the ring 305 may wirelessly couple with one or more electrical components of the cover 310. For instance, the inductive component 320 of the cover 310 may be configured to wirelessly communicate with an inductive component of the ring 305. Additionally, the inductive component 320 of the cover 310 may be configured to wirelessly transfer electrical current, data, or both between the one or more electrical components of the ring 305 with the one or more electrical components of the cover 310. In some examples, the inductive component 320 of the cover 310 may be configured to wirelessly communicate with the inductive component of the ring 305 based on the distance between the inductive component 320 of the cover 310 and the inductive component of the ring 305 (e.g., based on the inductive component 320 of the cover 310 being within a threshold distance of an inductive component 320 of the ring 305).

The cover 310 may include one or more electrical components, such as a memory 325, sensor(s) 330, a battery 340, etc., based on the functionality of the cover 310. Additionally or alternatively, the cover 310 may include a communication component 335. In some implementations, the ring 305 may be configured to interface with multiple different covers 310, where the covers 310 include different types of electrical components or support different functionality. In this regard, a user may be able to quickly interchange the cover 310 for the ring 305 to customize the functionality of the wearable device.

Similar to the memory 215 described with reference to FIG. 2, the memory 325 of the cover 310 may store data. The data stored by the memory 325 of the cover 310 may store data collected by the sensors 330 of the cover 310, the sensors 330 of the ring 305, or a combination thereof. In some aspects, the memory 325 of the cover 310 may include any volatile, non-volatile, magnetic, or electrical media that may be used to store the data (e.g., a random access memory (RAM), read-only memory (ROM), non-volatile RAM (NVRAM), electrically-erasable programmable ROM (EEPROM), flash memory, or any other memory device).

Although a user's physiological parameters may be measured by sensors included in the ring 305, the sensors 330 included in the cover 310 may also measure a user's physiological parameters. For example, although a user's temperature may be measured by a temperature sensor included in the ring 305, a temperature sensor of the sensors 330 included in the cover 310 may measure a user's temperature, environmental temperature, ambient temperature, etc., and generate signals that indicate the measured temperature data. Similarly, although a user's motion may be measured by an accelerometer included in the ring 305, an accelerometer included in the cover 310 may measure a user's movement or motion and generate motion signals that indicate motion data (e.g., acceleration of the accelerometer).

In some aspects, the sensors 330 included in the cover 310 may measure parameters associated with the environment of the user. Such environmental parameters may be undetected by the sensors included in the ring 305. For instance, in some examples, one or more of the sensors 330 may measure the humidity of the user's environment. Humidity sensors 330 may detect the concentration of water vapor present in the air of the user's environment. Additionally or alternatively, the one or more sensors 330 may measure the air quality of the user's environment. Air quality sensors of the sensors 330 may measure the air quality of the user's environment by detecting a concentration of one or more pollutants (e.g., particulate matter, ozone, Sulfur dioxide, nitrogen dioxide, carbon monoxide, lead, ammonia) in the air. It should be understood that any number of different types of the sensors 330, included herein or not, may be implemented in the cover 310.

Similar to the communication modules 220 described with reference to FIG. 2, the communication component 335 (e.g., wireless communications component) of the cover 310 may include circuits that provide wireless and/or wired communication with a user device (e.g., a smartphone). Additionally or alternatively, the communication component 335 of the cover 310 may include circuits that provide wireless and/or wired communication with a communication module of the ring 305. Additionally or alternatively, the communication component 335 of the cover 310 may include circuits that provide wireless communication with some other device. In some implementations, the communication component 335 may include wireless communication circuits (e.g., Bluetooth circuits and/or Wi-Fi circuits) or wired communication circuits (e.g., Universal Serial Bus (USB) communication circuits).

Using the communication component 335, the cover 310 may be configured to communicate with the ring 305 and/or the user device. The communication component 335 of the cover 310 may be used to transfer or receive data to/from the ring 305 and/or the user device. In some examples, the communication component 335 of the cover 310 may be a wireless communication component communicatively coupled to the one or more electrical components of the cover 310. In such examples, the communication component 335 may be configured to receive data acquired by one or more electrical components (e.g., sensors) of the cover 310 (e.g., temperature data, motion data, air quality data, humidity data), data acquired by one or more additional electrical components of the ring 305 (e.g., temperature data, motion data), or both. For example, the communication component 335 may receive data acquired by the one or more electrical components of the removable cover 310, the one or more additional electrical components of the wearable ring device (e.g., ring 305), or both, and may transmit the data to a user device 106 associated with the wearable ring device. In some cases, the communication component 335 may receive a first signal from the user device, and transmit a second signal from the removable cover 310 to the wearable ring device 305 via an electrical component based on receiving the first signal.

In some examples, the battery 340 of the cover 310 may be a rechargeable battery, which may be an example of the battery 210 as described with reference to FIG. 2. For example, the battery 340 of the cover 310 may include a Lithium-Ion or Lithium-Polymer type battery, although a variety of battery options are possible. In some aspects, the cover 310 may also include a charging component that may be used to charge the battery 340 when electrically coupled to the battery. That is, the charging component may be configured to receive an electrical current from a power source to charge the battery 340 when the charging component is electrically coupled to the battery. The battery 340 of the cover 310 may be wirelessly charged, charged via a wired connection to a power source, or a combination thereof. In some implementations, the cover 310 may include a power source other than the battery 340, such as a capacitor. In some cases, the battery 340 may be rechargeable while attached with the ring 305. For example, the cover 310 may be recharged when the ring 305 is recharged. In some cases, the battery 340 may be rechargeable when the cover 310 is detached from the ring 305, such as via a charger for the cover 310 (e.g., a same or different charger than used to recharge the ring 305). In some cases, one or more components of the ring 305 may provide power to the cover 310.

As described in more detail with reference to the subsequent figures, one or more features (e.g., electrical contact component 315 features, inductive component 320 features, or the like) may be included in the cover 310 to support a functional cover for the wearable device. As such, the one or more features of the cover 310 may provide for the enablement of additional functions for the wearable device, thereby allowing for increased flexibility in functionality and improved user experience.

Figure 4:
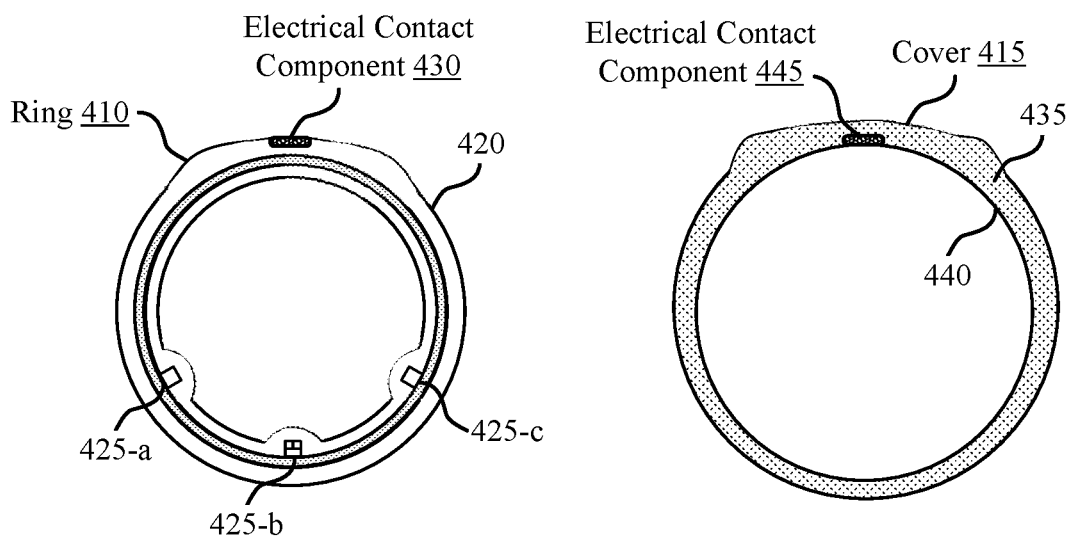
FIG. 4 illustrates an example of a wearable device diagram that supports functional covers with wireless connections for ring wearables in accordance with aspects of the present disclosure.
Figure 4:
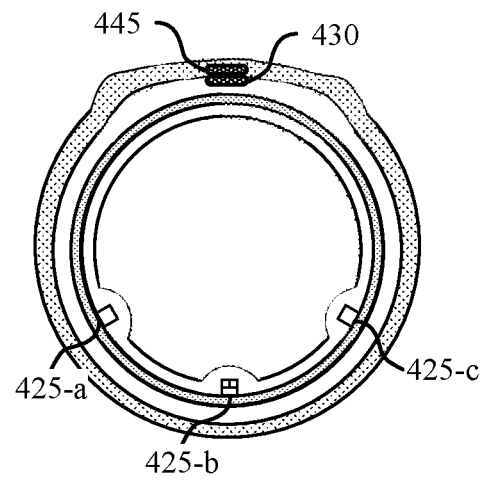

FIG. 4 illustrates an example of a wearable device diagram 400 that supports functional covers with wireless connections for ring wearables in accordance with aspects of the present disclosure. The wearable device diagram 400 may implement, or be implemented by, aspects of the system 100, system 200, wearable device diagram 300, or any combination thereof. For example, the wearable device diagram 400 may illustrate an example of a wearable device 104 as described with reference to FIG. 1. Although the wearable device is illustrated as a ring in FIG. 4, the wearable device may be any example of a wearable device (e.g., a watch, a necklace, and the like).

The wearable device diagram 400 may include a ring 410 and a cover 415, which may be examples of a ring 305 and a cover 310 as described with reference to FIG. 3. The ring 410 in wearable device diagram 400 may include a circumferential housing 420 that contains an inner housing, an outer housing, and an electronic substrate. The ring 410 may include a battery, a memory, and sensors 425, which may be examples of a battery 210, a memory 215, temperature sensor(s) 240, and motion sensor(s) 245 as described with reference to FIG. 2. The sensors 425 may be configured to acquire physiological data associated with the user. In some examples, the sensors 425 may be positioned at least partially within the circumferential housing 420. For example, the ring 410 may include a sensor 425-*a*, a sensor 425-*b*, and a sensor 425-*c*, and the sensors 425 may be embedded in the circumferential housing 420.

The cover 415 may include a removable cover that is associated with the ring 410. In some examples, the cover 415 may include a ring-shaped housing 435. Additionally or alternatively, the cover 415 may include an attachable module or component that may be attached or inserted into the circumferential housing 420 of the ring 410. In some examples, the cover 415 may include an attachable module that may replace or supplement a base module of the ring 410.

The cover 415 may contain one or more electrical components. For example, the cover 415 may contain a battery, memory, a communication component, sensors (e.g., air quality sensor(s), humidity sensor(s), temperature sensor(s), accelerometer(s)), or a combination thereof. The one or more electrical components of the cover 415 may be similar or different from the sensors 425 or the other additional electrical components of the ring 410. In some aspects, the cover 415 may be positioned such that the ring-shaped housing 435 at least partially covers the outer circumferential surface of the circumferential housing 420. In other aspects, the cover 415 may be positioned such that the ring-shaped housing 435 at least partially covers the inner circumferential surface of the circumferential housing 420.

In some examples, the ring 410 and the cover 415 may each include one or more electrical contact components. For example, the ring 410 may include an electrical contact component 430, and the cover 415 may include an electrical contact component 445. In some cases, the electrical contact components 430, the electrical contact component 445, or both, may include a through-hole component, a niobium terminal connector (e.g., an Nb connector), an elastomeric connector (e.g., a Zebra connector), or any combination thereof. In general, the electrical contact components 430, 445 may include any electrical contact components that are configured to physically and electrically interact with one another to facilitate the transfer of electrical current, data, or both, between the ring 410 and the cover 415.

The electrical contact component 445 may be exposed to the external surface 440 of the ring-shaped housing 435. In some cases, as described with reference to FIG. 4, the electrical contact component 430 may be exposed to the external surface positioned on an outer circumferential surface of the circumferential housing 420 of the ring 410, and the electrical contact component 445-*a* may be exposed to the external surface 440 of the inner circumferential surface of the ring-shaped housing 435 of the cover 415. That is, the electrical contact component 430 may be located on the outer face of the ring 410, and the electrical contact component 445 may be located on the inner face of the cover 415. In some other cases, the electrical contact component 430 may be positioned on the external surface of the inner circumferential surface of the circumferential housing 420 of the ring 410, and the electrical contact component 445 may be exposed to the external surface of the outer circumferential surface of the ring-shaped housing 435 of the cover 415. That is, the electrical contact component 430 may be located on the inner face of the ring 410, and the electrical contact component 445 may be located on the outer face of the cover 415, such that that the cover 415 would be placed inside the ring 410. The electrical contact component 445 may be configured to physically and electrically contact the electrical contact component 430 based on the positioning of the cover 415 on the ring 410. Additionally or alternatively, the electrical contact component 430 may be configured to physically and electrically contact the electrical contact component 445 based on the positioning of the cover 415 on the ring 410.

In some cases, the cover 415 may be in an unmounted state 405. When the cover 415 is in the unmounted state 405, the electrical contact component 445-*a* may not physically and electrically contact the electrical contact component 430. For instance, the cover 415 may be in the unmounted state 405 if the cover 415 is removed from the ring 410 by a user of the wearable device. Additionally or alternatively, the cover 415 may be considered to be in the unmounted state 405 while the cover 415 is positioned on the ring 410 if the electrical contact component 430 and the electrical contact component 445 are misaligned from one another. In other words, the cover 415 may be in the unmounted state 405 if the cover 415 is not properly attached or to the ring 410.

In other cases, the cover 415 may be in a mounted state 450. For example, when the cover 415 is in the mounted state 450, the electrical contact component 445 may be configured to physically and electrically contact the electrical contact component 430. When the cover 415 is in the mounted state 450, the electrical contact component 445 may transfer electrical current, data, or both between one or more electrical components of the cover 415 and one or more additional electrical components (e.g., sensor 425-a, sensor 425-b, and sensor 425-c) of the ring 410. For instance, the electrical contact component 445 may be configured to transfer electrical current from a battery contained in the cover 415 to the sensors 425-a, 425-b, and 425-c when the cover 415 is in the mounted state 450. The electrical current may be transferred from the battery contained in the cover 415 to the sensors 425 in addition to or instead of an electrical current that may be transferred from a battery contained in the ring 410 to the sensors 425.

In some aspects, the cover 415 may include a charging component that is electrically coupled to the battery of the cover 415. The charging component may be configured to receive an electrical current from a power source to charge the battery of the cover 415. In some examples, the user may detach the cover 415 from the ring 410 if the battery contained in the cover 415 is depleted so that the battery contained in the cover 415 may be charged for future use. In such examples, a new cover 415 containing a battery that is partially or fully charged and an electrical contact component may be positioned in the mounted state 450 such that the electrical current may be transferred to the sensors 425 of the ring 410.

In some cases, the cover 415 may not have a dedicated power source. In such cases, the cover 415 may perform one or more operations by using power transferred from the ring 410. In order for the electrical components of the cover 415 to perform the one or more operations, the electrical contact component 445 may transfer an electrical current between electrical components of the ring 410 and electrical components of the cover 415. That is, the electrical contact component 445 may be configured to transfer the electrical current from the one or more additional electrical components of the ring 410 to the one or more electrical components of the cover 415, enabling the one or more electrical components of the cover 415 to perform the one or more operations.

In some implementations, the cover 415 may acquire and transmit data to the ring 410 when the cover 415 is in the mounted state 450. The cover 415 may include one or more electrical components, and one or more sensors of the one or more electrical components may be configured to acquire data. For example, the cover 415 may include an air quality sensor, among other electrical components. The air quality sensor may be configured to measure data indicating the concentration of one or more of a subset of pollutants in the air. When the cover 415 is in the mounted state 450, the electrical contact component 445-b may be configured to transfer data acquired by the one or more sensors to one or more additional electrical components in the ring 410. For example, when in the mounted state 450, the electrical contact component 445 may electrically and physically contact the electrical contact component 430, enabling the electrical contact component 445 to transfer electrical current and/or data between the one or more electrical components of the cover 415 and the one or more additional electrical components of the ring 410. Accordingly, for the previous example where the cover 415 includes an air quality sensor configured to measure air quality data, the electrical contact component 445 may transmit the air quality measurement data to the one or more additional electrical components in the ring 410 (e.g., the memory of the ring 410).

In some implementations, the one or more sensors of the cover 415 may be configured to acquire data even when the cover is in the unmounted state 405. In such cases, acquired data may be stored in a memory of the cover 415 (e.g., memory 325), and may be communicated to the ring 410 when the cover 415 is subsequently attached to the ring 410 in the mounted state 450.

In some aspects, the cover 415 may communicate with a user device (e.g., a smartphone) associated with the ring 410 via a wireless communication component. For example, the cover 415 may include a wireless communication component, and the wireless communication component may be communicatively coupled to the one or more electrical components of the cover 415. In some cases, the wireless communication component may be communicatively coupled to the one or more sensors of the ring 410. The wireless communication component may be configured to receive data acquired by the one or more electrical components of the cover 415, the one or more additional electrical components of the ring 410, or both. In this regard, in some aspects, the cover 415 may serve as an antenna or other wireless communication component to facilitate or improve communication capabilities of the ring 410.

Additionally, the wireless communication component may be configured to transmit the data to a user device associated with the ring 410. For instance, the wireless communication component receives air quality data from an air quality sensor included in the cover 415 and the wireless communication component also receives temperature data from a temperature sensor included in the ring 410. Based on receiving the air quality data and the temperature data, the wireless communication component may transmit the air quality data, the temperature data, and/or other received data to a smartphone associated with the ring 410.

Additionally or alternatively, the wireless communication component may be further configured to communicate an electrical current to the ring 410 via the electrical contact component 445 based on receiving a signal from the user device associated with the ring 410, or vice versa. For example, the user device may send a signal to the wireless communication component of the cover 415 indicating that a software update may be made to electrical components of the ring 410. Based on receiving the signal indicating the software update, the cover 415 may send an electrical current to the ring 410 through the electrical contact component 445 in order to convey the software update signal to the ring 410.

In some aspects, the electrical contact component 445 may be configured to transfer an electrical current from the one or more additional electrical components of the ring 410 to the one or more electrical components of the cover 415, enabling the one or more electrical components of the cover to perform one or more operations. For example, the cover 415 may contain a communication component that is configured to receive data acquired by the sensors 425 of the ring 410, receive data acquired by sensors of the cover 415, or both.

As described in more detail with reference to FIGS. 6-7, locking components of the wearable device may be configured to secure the cover 415 to the ring 410 when the cover 415 is in the mounted state 450 (e.g., secure the cover 415 in the mounted state 450). In some examples, the cover 415 may be secured to the ring 410 in a defined orientation that enables physical and electrical contact between the electrical contact component 430 of the ring 310 and the electrical contact component 445 of the cover 415. For instance, when in the mounted state 450, the cover 415 may be fastened to the ring 410 such that one or more boundaries of the electrical contact component 445 is aligned with one or more boundaries of the electrical contact component 430, and such that electrical current may be transferred between the electrical contact component 445 and the electrical contact component 430.

Figure 5:
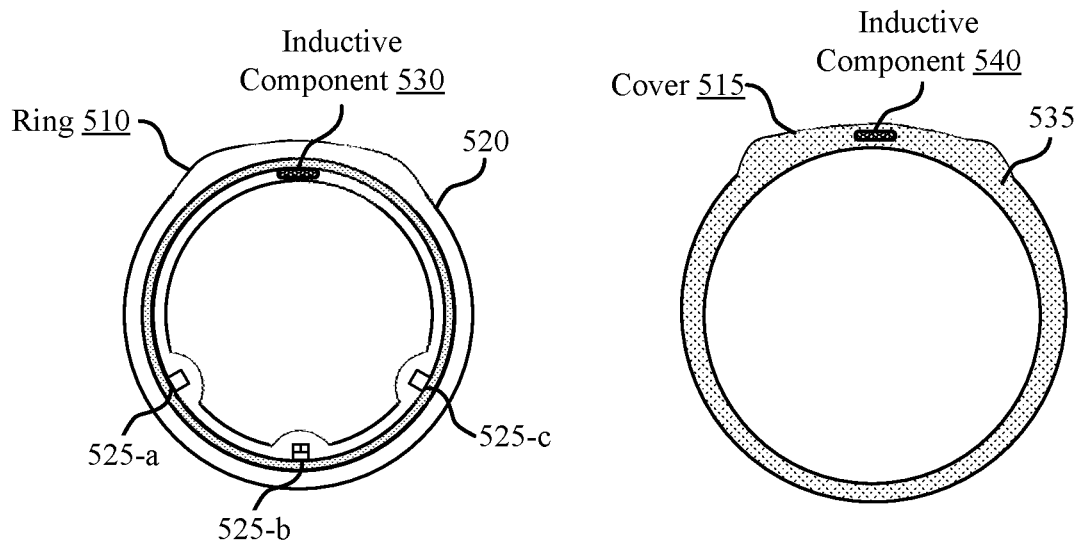
FIG. 5 illustrates an example of a wearable device diagram that supports functional covers with wireless connections for ring wearables in accordance with aspects of the present disclosure.
Figure 5:
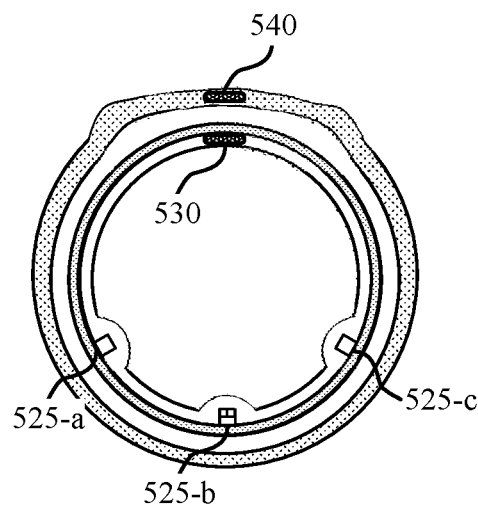

FIG. 5 illustrates an example of a wearable device diagram 500 that supports functional covers with wireless connections for ring wearables in accordance with aspects of the present disclosure. The wearable device diagram 500 may implement, or be implemented by, aspects of the system 100, system 200, wearable device diagram 300, wearable device diagram 400, or a combination thereof. For example, wearable device diagram 500 may illustrate examples of wearable devices 104 as described with reference to FIGS. 1-4. Although the wearable device diagram 500 is illustrated as a ring in FIG. 5, aspects and components of the wearable device diagram 500 illustrated in FIG. 5 may be implemented in any type of wearable device (e.g., a watch, a bracelet, a necklace, and the like).

As described herein, such as with reference to FIG. 4, the wearable device may be configured to connect with one or more removable covers (e.g., removable modules, functional covers, function modules). The wearable device diagram 500 may include a ring 510 and a cover 515. The ring 510 in wearable device diagram 500 may include a circumferential housing 520 which may be an example of the housing as described with reference to FIGS. 2-4. The ring 510 may include a battery, a memory, sensors 525, and other electrical components, which may be examples of a battery, a memory, temperature sensor(s), motion sensor(s), and other electrical components as described with reference to FIGS. 2-4. For example, the ring 510 may include a sensor 525-*a*, a sensor 525-*b*, and a sensor 525-*c*.

The cover 515 may include a ring-shaped housing 535. In some aspects, the cover 515 may be positioned in a mounted state 545 such that the ring-shaped housing 535 at least partially surrounds the circumferential housing 520 of the ring 510. Additionally or alternatively, the cover 515 may be positioned in the mounted state 545 such that the ring-shaped housing 535 at least partially fills the inner circumference of the circumferential housing 520. In some examples, the cover 515 may include a component or module that may be positioned in the mounted state 545 such that the component or module of the cover 515 at least partially covers the circumferential housing 520 of the ring 510.

In some examples, the ring 510 may include an inductive component 530, and the cover 515 may include an inductive component 540. The inductive components 530, 540 may include any inductive components that are configured to wirelessly communicate with one another to enable the transfer of power (e.g., electrical current), data, or both, between the ring 510 and the cover 515.

The inductive component 530-*a*, the inductive component 540, or both may include a transmitter coil, a receiver coil, ferrite tape, or any combination thereof. In some examples, the inductive component 530 may be positioned within the ring 510 (e.g., within the circumferential housing 420), and the inductive component 540 may be positioned within the cover 515 (e.g., within the ring-shaped housing 535). In some implementations, the inductive component 540 of the cover 515 may be positioned proximate to an inner circumferential surface of the ring-shaped housing 535. That is, the inductive component 540 may be positioned in the ring-shaped housing 535 of the cover 515 such that the inductive component 540 is nearer to the inner circumferential surface of the ring-shaped housing 535 than an outer circumferential surface of the ring-shaped housing.

The inductive component 540 may be configured to wirelessly communicate with the inductive component 530 based on the positioning of the cover 515 on the ring 510. Additionally or alternatively, the inductive component 530 may be configured to wirelessly communicate with the inductive component 540 based on the positioning of the cover 515 on the ring 510. In some cases, the cover 515 may be in an unmounted state 505 or a mounted state 545. The mounted state 545 may be configured to position the inductive component 540 of the cover 515 within a threshold distance from inductive component 530-*b* of the ring 510. In other words, the mounted state 545 may be configured to align the inductive component 540 of the cover with the inductive component 530 of the ring 510. Comparatively, the cover 515 may be in the unmounted state 505 when a distance between the inductive component 540 of the cover 515 and the inductive component 530 of the ring 510 is greater than a threshold distance.

When the cover 515 is in the mounted state 545, the inductive component 540 of the cover 515 may be configured to wirelessly communicate with the inductive component 530 of the ring 510. Additionally, when the cover 515 is in the mounted state 545, the inductive component 540 of the cover 515 may be further configured to transfer electrical current, data, or both between one or more electrical components of the cover 515 and one or more additional electrical components (e.g., sensor 525-*a*, sensor 525-*b*, and sensor 525-*c*) of the ring 510. For instance, the inductive component 540 may be configured to transfer electrical current from a battery contained in the cover 515 to the sensors 525-*a*, 525-*b*, and 525-*c* when the cover 515 is in the mounted state 545. The electrical current may be transferred from the battery contained in the cover 515 to the sensors 525 in addition to or instead of an electrical current that may be transferred from the battery contained in the ring 510 to the sensors 525.

In some aspects, the cover 515 may include an inductive charging component that is electrically coupled to the battery of the cover 515. The inductive charging component may be configured to receive an electrical current from a power source to charge the battery of the cover 515. Additionally, the inductive charging component may transfer power from the battery of the cover 515 to the electrical components of the ring 510. In some examples, the user may detach the cover 515 from the ring 510 if the battery contained in the cover 515 is depleted so that the battery contained in the cover 515 may be charged for future use. In such examples, a new cover containing a battery that is partially or fully charged may be positioned in the mounted state 545 such that the electrical current may be transferred to the sensors 525 of the ring 510.

In some implementations, the cover 515 may acquire and transmit data to the ring 510 when the cover 515 is in the mounted state 545. The cover 515 may include one or more electrical components, and one or more sensors of the one or more electrical components may be configured to acquire data. When the cover 515 is in the mounted state 545, the inductive component 540 may be configured to transfer data acquired by the one or more sensors of the cover 515 to one or more additional electrical components in the ring 510. For example, when in the mounted state 545, the inductive component 540 may wirelessly communicate with the inductive component 530, enabling the inductive component 540 to transfer electrical current and/or data between the one or more electrical components of the cover 515 and the one or more additional electrical components of the ring 510. For example, if the cover 515 includes a humidity sensor configured to measure a concentration of water vapor in the air, the inductive component 540 may transmit humidity measurement data to the one or more additional electrical components in the ring 510 (e.g., the memory of the ring 510).

The cover 515 may communicate with a user device (e.g., a smartphone) associated with the ring 510 via a wireless communication component that is communicatively coupled to the one or more electrical components of the cover 515. In some cases, the wireless communication component may be communicatively coupled to the one or more sensors of the ring 510. The wireless communication component may be configured to receive data acquired by the one or more electrical components of the cover 515, the one or more additional electrical components of the ring 510, or both. Additionally or alternatively, the wireless communication component may be configured to transmit the data to a user device associated with the ring 510. For instance, the wireless communication component receives humidity data from a humidity sensor included in the cover 515 and the wireless communication component also receives motion data from a motion sensor included in the ring 510. Based on receiving the humidity data and the motion data, the wireless communication component may transmit the humidity data, the motion data, and/or other received data to a smartphone associated with the ring 510.

Additionally or alternatively, the wireless communication component may be further configured communicate an electrical current to the ring 510 via the inductive component 540 based on receiving a signal from the user device associated with the ring 510. For example, the user device may send a signal to the wireless communication component of the cover 515 indicating that a software update may be applied to electrical components of the ring 510. Based on receiving the signal indicating the software update, the cover 515 may send an electrical current to the ring 510 through the inductive component 540 in order to convey the software update signal to the ring 510.

As described in more detail with reference to FIGS. 6-7, locking components of the wearable device may be configured to secure the cover 515 to the ring 510 when the cover 515 is in the mounted state 545. In some examples, the cover 515 may be secured to the ring 510 in a defined positioning and/or orientation that enables the inductive component 540 of the cover 515 to wirelessly communicate with the inductive component 530 of the ring 510. For instance, when in the mounted state 545, the cover 515 may be fastened to the ring 510 such that one or more boundaries of the inductive component 540 is aligned with one or more boundaries of the inductive component 540 and such that a distance equal to or less than the threshold distance is maintained between the inductive component 540 and the inductive component 530.

Figure 6:
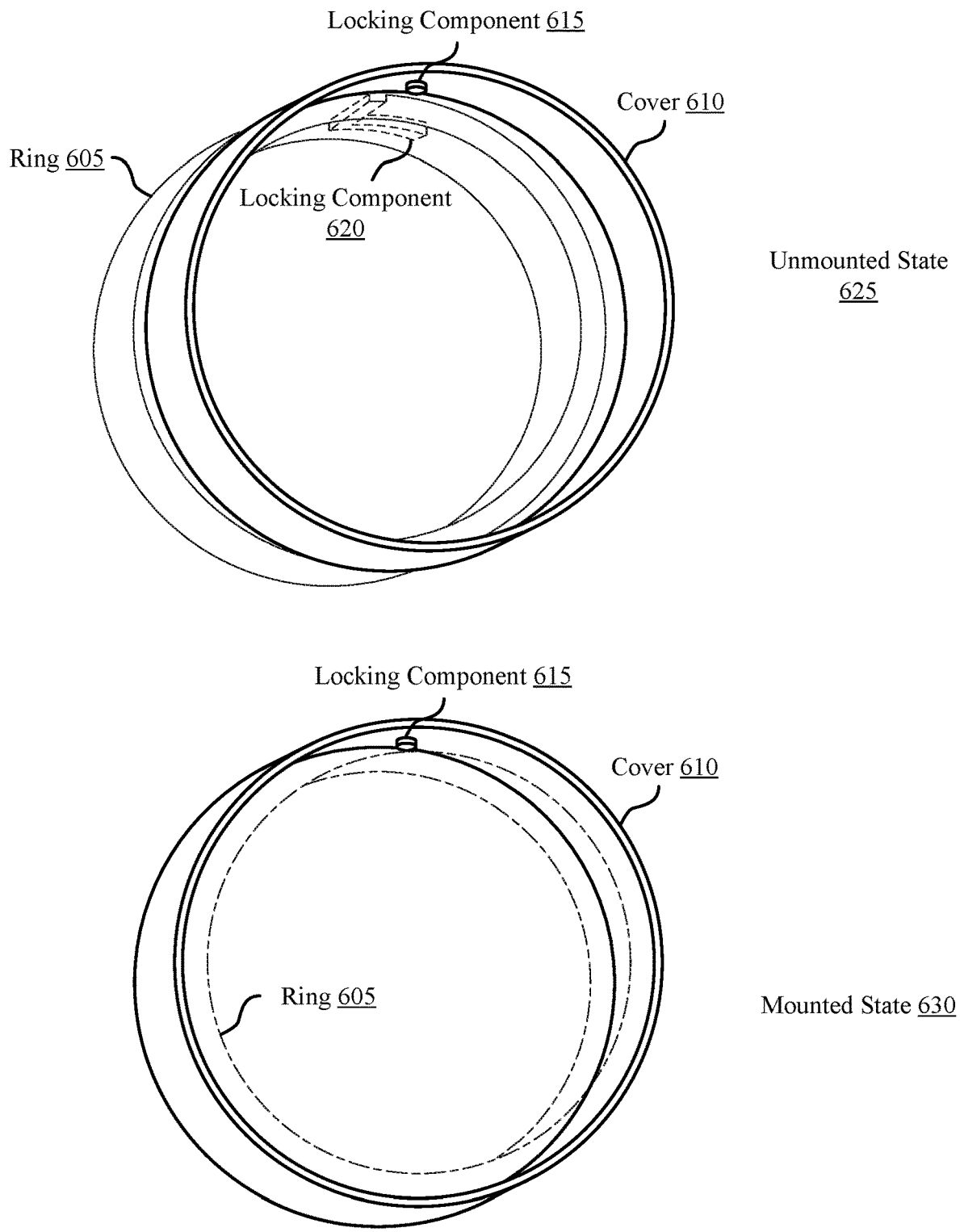
FIG. 6 illustrates an example of a locking mechanism that supports functional covers with wireless connections for ring wearables in accordance with aspects of the present disclosure.

FIG. 6 illustrates an example of a locking mechanism 600 that supports functional covers with wireless connections for ring wearables in accordance with aspects of the present disclosure. The locking mechanism 600 may implement, or be implemented by, aspects of the system 100, system 200, wearable device diagram 300, wearable device diagram 400, wearable device diagram 500, or a combination thereof. For example, the locking mechanism 600 may be implemented by wearable devices 104 that are described with reference to FIGS. 1-5. Although the locking mechanism 600 is illustrated to be implemented by a ring wearable in FIG. 6, aspects and components of the locking mechanism 600 illustrated in FIG. 6 may be implemented in any type of wearable device (e.g., a watch, a bracelet, a necklace, and the like).

A wearable device may include a ring 605 and a cover 610, which may be examples of the ring and the cover described with reference to FIGS. 3-5. In some aspects, the wearable device may include a locking mechanism 600 that is configured to secure the cover 610 to the ring 605 in the mounted state 630. In some aspects, the mounting mechanism 600 may include a locking component 615 associated with the cover 610, and a locking component 620 associated with the ring 605, where the locking mechanisms 615, 620 are configured to interface or engage with one another to secure the cover 610 in the mounted state 630. The locking component 615 of the cover 610 and/or the locking component 620 of the ring 605 may each include a tab, a groove, a detent, a button, a magnet, a channel, or any combination thereof.

In some aspects, the locking mechanism 620 may be configured to enable a user to quickly and easily attach and remove the cover 610 from the ring 605 (e.g., quickly transition from the mounted state 630 to the unmounted state 625, and vice versa). In additional or alternative implementations, the locking mechanism 600 may be associated with (e.g., require) an unlocking mechanism that is used to remove the cover 610 from the ring 605.

In some examples, the locking component 615 may include a tab, and the locking component 620 may include a channel. The tab of the locking component 615 may be a mounting feature that extends from the internal surface of the cover 610. The channel of the locking component 620 may be integrated into the surface of the ring 605. The tab of the locking component 615 may slide and lock into the channel of the locking component 615, enabling the cover 610 to transition from the unmounted state 625 to a mounted state 630. In such examples, the tab of the locking component 615 may be positioned within the channel of the locking component 620 and slide along the channel such that the cover 610 slides directly onto the ring 605 in a first direction. Additionally or alternatively, the tab may slide along the channel of the locking component 620 such that the cover 610 rotates relative to an axis of the ring 605, locking the cover 610 into the mounted state 630.

In the mounted state 630, the locking component 615 of the cover 610 may be configured to engage the locking component of the ring 605 such that the cover 610 is secured to the ring 605. In some implementations, as shown and described with respect to FIG. 3, the ring 605 may include a first electrical contact component, and the cover 610 may include a second electrical contact component. The first electrical contact component of the ring 605 and the second electrical contact component of the cover 610 may be examples of the electrical contact component of the ring and the electrical contact component of the cover as described with reference to FIGS. 3-4. In some examples, the locking component 615 may be configured to engage with the locking component of the ring such that the cover 610 is in a defined orientation, enabling the first electrical contact component of the ring 605 to physically and electrically contact the second electrical contact component of the cover 610. Therefore, electrical current, data, or both, may be transferred between electrical components of the cover 610 and additional electrical components of the ring 605, enabling the cover 610 and the ring 605 to communicate data, transfer power, and/or receive power, between one another.

In some other implementations, as shown and described with respect to FIG. 4, the cover 610 may include a first inductive component, and the ring 605 may include a second inductive component. The first inductive component and the second inductive component may be examples of the inductive component of the cover and the inductive component of the ring as described with reference to FIGS. 3-4. In such other implementations, the mounted state 630 may be configured to position the first inductive component of the cover 610 within a threshold distance from the second inductive component of the ring 605. Based on being positioned with the threshold distance from the second component of the ring 605, the first inductive component of the cover 610 may be configured to wirelessly communicate with the second inductive component of the ring 605. Therefore, electrical current, data, or both, may be transferred between electrical components of the cover 610 and additional electrical components of the ring 605, enabling the cover 610 and the ring 605 to wirelessly communicate data, wirelessly transfer power, and/or wirelessly receive power, between one another.

While the locking mechanism 600 is shown and in FIG. 6 as a tab-and-groove locking mechanism, this is not to be regarded as a limitation of the present disclosure, unless noted otherwise herein. In this regard, other locking mechanisms that secure the cover 610 to the ring 605 in the mounted state 630 are contemplated.

Figure 7:
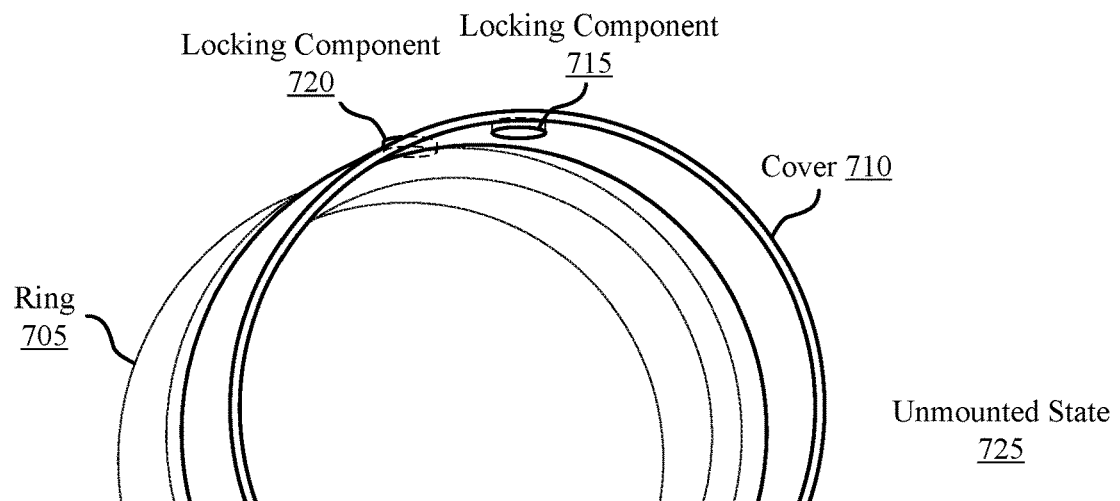
FIG. 7 illustrates an example of a locking mechanism that supports functional covers with wireless connections for ring wearables in accordance with aspects of the present disclosure.
Figure 7:
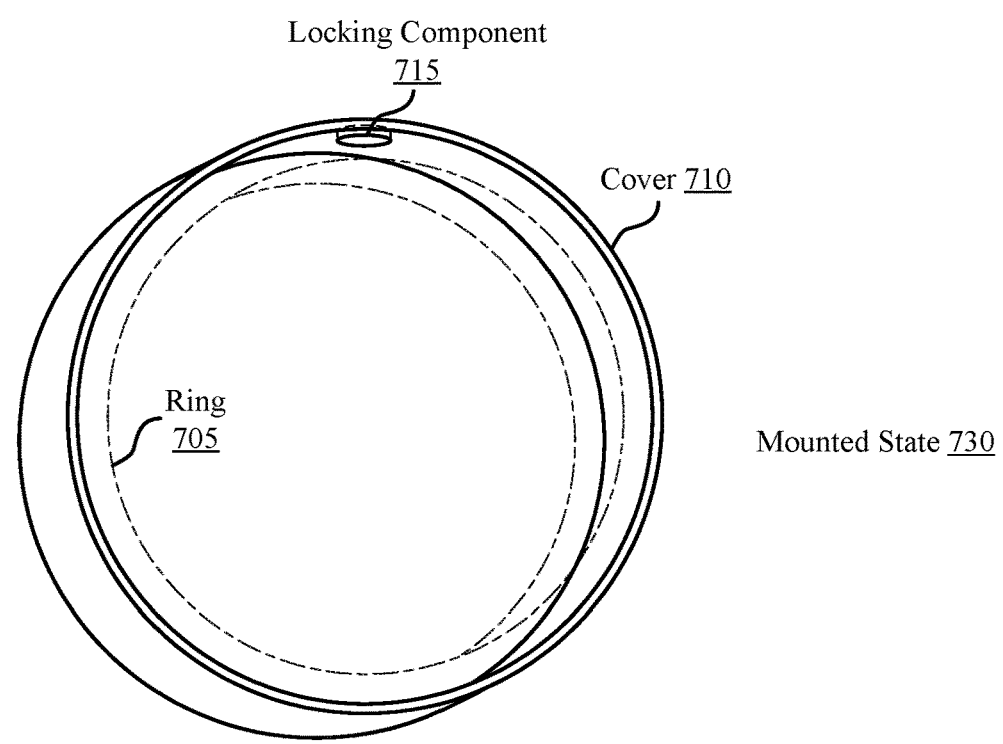

FIG. 7 illustrates an example of a locking mechanism 700 that supports functional covers with wireless connections for ring wearables in accordance with aspects of the present disclosure. The locking mechanism 700 may implement, or be implemented by, aspects of the system 100, system 200, wearable device diagram 300, wearable device diagram 400, wearable device diagram 500, or a combination thereof. For example, the locking mechanism 700 may be implemented by wearable devices 104 that are described with reference to FIGS. 1-6. Although the locking mechanism 700 is illustrated to be implemented by a ring wearable in FIG. 7, aspects and components of the locking mechanism 700 illustrated in FIG. 7 may be implemented in any type of wearable device (e.g., a watch, a bracelet, a necklace, and the like).

A wearable device may include a ring 705 and a cover 710, which may be examples of the ring and the cover described with reference to FIGS. 3-5. In some aspects, the wearable device may include a locking mechanism 700 that is configured to secure the cover 710 to the ring 705 in the mounted state 730. In some aspects, the mounting mechanism 700 may include a locking component 715 associated with the cover 710, and a locking component 720 associated with the ring 705, where the locking mechanisms 715, 720 are configured to interface or engage with one another to secure the cover 710 in the mounted state 730. The locking component 715 of the cover 710 and/or the locking component 720 of the ring 705 may each include a tab, a groove, a detent, a button, a magnet, a channel, or any combination thereof.

In some aspects, the locking mechanism 720 may be configured to enable a user to quickly and easily attach and remove the cover 710 from the ring 705 (e.g., quickly transition from the mounted state 730 to the unmounted state 725, and vice versa). In additional or alternative implementations, the locking mechanism 700 may be associated with (e.g., require) an unlocking mechanism that is used to remove the cover 710 from the ring 705.

In some examples, the locking component 715 may include a hole, and the locking component 720 may include a button. The button of the locking component 720 may be a mounting feature that extends from the internal surface of the ring 705. The hole of the locking component 715 may be a protrusion integrated into the surface of the cover 710. The button of the locking component 720 may fill hole of the locking component 715, enabling the cover 710 to transition from the unmounted state 725 to a mounted state 730. In such examples, the button of the locking component 720 may be locked within the hole of the locking component 715, locking the cover 710 into the mounted state 730.

In the mounted state 730, the locking component 715 of the cover 710 may be configured to engage the locking component of the ring 705 such that the cover 710 is secured to the ring 705. In some implementations, the ring 705 may include a first electrical contact component, and the cover 710 may include a second electrical contact component. The first electrical contact component of the ring 705 and the second electrical contact component of the cover 710 may be examples of the electrical contact component of the ring and the electrical contact component of the cover as described with reference to FIGS. 3-4. In some examples, the locking component 715 may be configured to engage with the locking component of the ring such that the cover 710 is in a defined orientation, enabling the first electrical contact component of the ring 705 to physically and electrically contact the second electrical contact component of the cover 710. Therefore, electrical current, data, or both, may be transferred between electrical components of the cover 710 and additional electrical components of the ring 705, enabling the cover 710 and the ring 705 to communicate data, transfer power, and/or receive power, between one another.

In some other implementations, the cover 710 may include a first inductive component, and the ring 705 may include a second inductive component. The first inductive component and the second inductive component may be examples of the inductive component of the cover and the inductive component of the ring as described with reference to FIGS. 3-4. In such other implementations, the mounted state 730 may be configured to position the first inductive component of the cover 710 within a threshold distance from the second inductive component of the ring 705. Based on being positioned with the threshold distance from the second component of the ring 705, the first inductive component of the cover 710 may be configured to wirelessly communicate with the second inductive component of the ring 705. Therefore, electrical current, data, or both, may be transferred between electrical components of the cover 710 and additional electrical components of the ring 705, enabling the cover 710 and the ring 705 to wirelessly communicate data, wirelessly transfer power, and/or wirelessly receive power, between one another. While locking mechanisms are described with reference to FIGS. 6 and 7, it should be understood that any locking mechanism may be implemented to secure a cover 710 to a wearable device, such as a ring 705.

It is contemplated here that different locking mechanisms and techniques may be used to secure the cover of to the wearable ring device. Other locking mechanisms that may be used may include, but are not limited to, may include hinges, clasps, elastic portions of the cover, deformable portions of the cover, and the like. In other cases, friction, tabs, detents, and the like may be used. In some cases, the cover may be rotated, flipped, or spun onto the wearable ring device. For example, the cover may include an inner circumferential surface that is slightly larger than an outer circumferential surface of the wearable ring device so that the cover may be placed around the wearable ring device and rotated or spun into place so that the inner circumferential surface of the cover is adjacent to (e.g., contacts) the outer circumferential surface of the wearable ring device.

Figure 8:
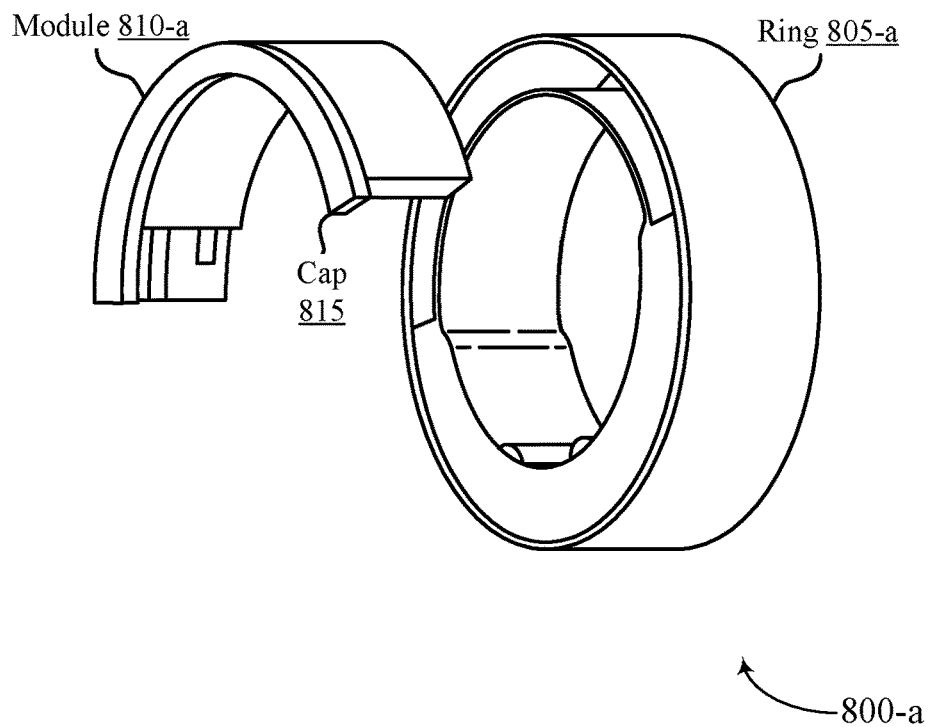
FIG. 8 illustrates examples of wearable device diagrams that support functional covers with wireless connections for ring wearables in accordance with aspects of the present disclosure.
Figure 8:
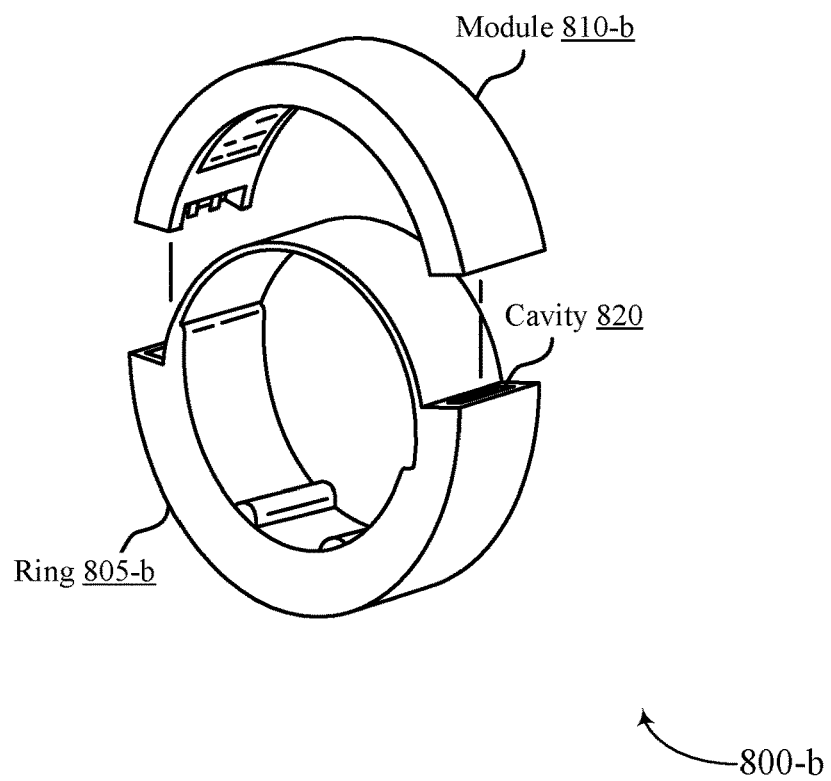

FIG. 8 illustrates examples of a wearable device diagrams 800-a, 800-b that support functional covers with wireless connections for ring wearables in accordance with aspects of the present disclosure. The wearable device diagram 800-a may implement, or be implemented by, aspects of the system 100, system 200, wearable device diagram 300, wearable device diagram 400, wearable device diagram 500, or a combination thereof. For example, the wearable device diagram 800-a may be implemented by wearable devices 104 that are described with reference to FIGS. 1-7. Although the wearable device diagram 800-a is illustrated to be implemented by a ring wearable in FIG. 8, aspects and components of the wearable device diagram 800-a illustrated in FIG. 8 may be implemented in any type of wearable device (e.g., a watch, a bracelet, a necklace, and the like).

A wearable device may include a ring 805-a and a module 810-a, which may be examples of the ring and the cover described with reference to FIGS. 3-5. In some examples, a user of the wearable device may update the wearable device and/or add additional functionality to the wearable device by mounting the module 810-a onto the ring 805-a via a side load configuration. For example, the module 810-a may be an over-molded component of the wearable device, and the module 810-a may be manufactured to be inserted into an empty space (e.g., cavity) within the ring 805-a to secure the module 810-a in a mounted state. For example, the module 810-a may be inserted between two external surfaces on the ring 805-a, such as an inner external surface that contacts the skin of a user, and an outer external surface that is exposed to the environment. In some cases, the module 810-a may rest against an edge of the ring 805-a, where the edge may connect the inner and external surfaces of the ring 805-a. In some other cases, the ring 805-a may not include such an edge, at least where the module 810-a fits into place. In such cases, the module 810-a may be configured with such an edge that when mounted, the module 810-a connects the inner and outer external surfaces of the ring 805-a. In some examples, the module 810-a may be ring-shaped (e.g., curved). In other examples, the module 810-a may be block-shaped.

The wearable device may implement locking mechanisms as described with reference to FIGS. 6 and 7 to lock module 810-a into place with ring 805-a. In some cases, the module may be configured with one or more side end caps 815 (e.g., such as on the left and/or right of the module 810-a depicted in FIG. 8) that would seal in (e.g., lock in) the module to the ring 805-a. For example, an end cap 815 may protect the module 810-a and/or other internal components of the ring 805-a from environmental factors such as water, dirt, etc. In some other cases, one or more side end caps 815 may be separate components of the ring 805-a that may be removed to access, replace, or exchange the module 810-a. In some cases, magnets (e.g., on one or both of ring 805-a and module 810-a) or some other force may keep lock the module 810-a into place of the ring 805-a.

The module 810-a may include a battery module (e.g., battery cell), a fitness tracker module, an air quality module, a wireless communications module, a location module, a safety module, etc. In some cases, the module 810-a may provide multiple additional functionalities (e.g., a battery and an air quality module, an air quality module and a fitness tracker module) to the wearable device. In accordance with techniques described herein, the module 810-a may provide a user with the flexibility to provide additional functionality to the ring 805-a, and/or a wearable device may be configured with a replaceable module 810-a so as to extend the lifespan of the wearable device even if a module 810-a fails. For example, in the case that the module 810-a is a battery, a user may replace the battery module 810-a as needed (e.g., as the battery module 810-a fails to hold a charge, as the battery module 810-a ages) while keeping the existing ring 805-a.

The module 810-a may be attached to the ring 805-a by sliding into a cavity of the ring 805-a from the side of the ring 805-a. The module 810-a may include electronic and/or inductive components that are capable of producing the functions attributed to the module 810-a when the module 810-a is loaded into the ring 805-a such that the module 810-a is in the mounted state. For example, if the module 810-a includes a first electrical contact component, the ring 805-a includes a second electrical contact component, and the module 810-a is inserted into the ring 805-a such that the first electrical contact component and the second electrical contact component physically and electronically interface, then the first electrical contact component of the module 810-a may transfer electrical current, data, or both, between electrical components included in the module 810-a and additional electrical components included in the ring 805-a. Additionally or alternatively, if the module 810-a includes a first inductive component and the ring 805-a includes a second inductive component, then the first inductive component may wirelessly communicate with the second inductive component, enabling the first inductive component of the module 810-a to transfer electrical current, data, or both between electrical components of the module 810-a and additional electrical components of the ring 805-a. Accordingly, the wearable device may have added functionality respective to the function attributed to the module 810-a.

Reference will now be made to the wearable device diagram 800-b illustrated in FIG. 8. As shown in the wearable device diagram 800-b, a wearable device may include a ring 805-b and a module 810-b, which may be examples of the ring and the cover described with reference to FIGS. 3-5. In some examples, a user of the wearable device may update the wearable device and/or add additional functionality to the wearable device by mounting the module 810-b onto the ring 805-b via a top load configuration. In some cases, the module 810-b may be placed and rest on an inner external surface of the ring 805-a (as depicted in FIG. 8B). In some cases, the ring 805-a may not be configured with a complete ring shape, where to complete the wearable device (e.g., complete the circumference of the ring 805-b), the module 810-b would need to be attached to the ring 805-a. In such cases, the module 810-a would not rest on an inner external surface of the ring 805-a. For example, the module 810-b may be an over molded component of the wearable device, and the module 810-*b* may be manufactured to be attached to the ring 805-*b* such that the module 810-*b* is in a mounted state. The wearable device may implement locking mechanisms as described with reference to FIGS. 6 and 7 to lock module 810-*b* into place with ring 805-*b*. In some cases, the module 810-*a* may include a locking mechanism at one or both of the ends of the module 810-*a*. For example, the ends of module 810-*a* may include a snap feature that snap into place in cavities 820 of the external surface of the ring 805-*a*. In some cases, magnets (e.g., on one or both of ring 805-*b* and module 810-*b*) or some other force may keep lock the module 810-*b* into place of the ring 805-*b*. In some cases, the configuration depicted in FIG. 8 may be combined to create some combination of a top loading, side loading module 810-*a*.

As described with reference to the wearable device diagram 800-*a*, the module 810-*b* may include a battery module (e.g., battery cell), a fitness tracker module, an air quality module, a wireless communications module, a location module, a safety module, or any combination thereof in some implementations, the module 810-*b* may include electronic and/or inductive components that are capable of producing the functions attributed to the module 810-*b* when the module 810-*b* is loaded into the ring 805-*b* such that the module 810-*b* is in the mounted state.

The module 810-*b* may be mounted onto the ring 805-*b* with application of a top load such that the module 810-*b* at least partially covers the external surface of the ring 805-*b*. The module 810-*a* may extend along any percentage of the ring 805-*a*. For example, the module 810-*a* may extend 50 percent of the outer external of the ring 805-*b*. In some examples, the module 810-*b* may transition from an unmounted state to a mounted state based on whether sufficient load is applied by the user upon attaching the module 810-*b* to the ring 805-*a*. Accordingly, the wearable device may have added functionality respective to the function attributed to the module 810-*b* based on the module 810-*b* being in the mounted state.

It should be noted that the methods described above describe possible implementations, and that the operations and the steps may be rearranged or otherwise modified and that other implementations are possible. Furthermore, aspects from two or more of the methods may be combined.

An apparatus is described. The apparatus may include one or more electrical components positioned at least partially within the removable cover and a first inductive component positioned within the removable cover, the first inductive component configured to wirelessly communicate with a second inductive component of the wearable ring device when the removable cover is in a mounted state on the wearable ring device, wherein the first inductive component is further configured to transfer electrical current, data, or both, between the one or more electrical components of the removable cover and one or more additional electrical components of the wearable ring device.

In some examples of the apparatuses, a first locking component configured to engage a second locking component of the wearable ring device to secure the removable cover to the wearable ring device in the mounted state, wherein the mounted state may be configured to position the first inductive component of the removable cover within a threshold distance from the second inductive component of the wearable ring device, and wherein the first inductive component may be configured to wirelessly communicate with the second inductive component based at least in part on being positioned within the threshold distance from the second inductive component.

In some examples of the apparatuses, the first locking component comprises a tab, a groove, a detent, a button, a magnet, or any combination thereof.

In some examples of the apparatuses, the first inductive component comprises a transmitter coil, a receiver coil, ferrite tape, or any combination thereof.

In some examples of the apparatuses, a wireless communication component that may be communicatively coupled to the one or more electrical components of the removable cover, wherein the wireless communication component may be configured to, receive data acquired by the one or more electrical components of the removable cover, the one or more additional electrical components of the wearable ring device, or both, and transmit the data to a user device associated with the wearable ring device.

Some examples of the apparatuses may further include operations, features, means, or instructions for receive a first signal from the user device and transmit a second signal from the removable cover to the wearable ring device via the first inductive component based at least in part on receiving the first signal.

In some examples of the apparatuses, the removable cover comprises a ring-shaped housing that may be configured to at least partially surround the wearable ring device in the mounted state and the first inductive component may be positioned proximate to an inner circumferential surface of the ring-shaped housing.

In some examples of the apparatuses, the one or more electrical components of the removable cover comprise a battery and the first inductive component comprises an inductive charging component that may be configured to transfer power from the battery to the one or more additional electrical components of the wearable ring device.

In some examples of the apparatuses, a charging component electrically coupled to the battery, wherein the charging component may be configured to receive an electrical current from a power source to charge the battery.

In some examples of the apparatuses, the one or more electrical components of the removable cover comprise one or more sensors configured to acquire data and the first inductive component may be configured to transfer data acquired by the one or more electrical components to the one or more additional electrical components of the wearable ring device.

In some examples of the apparatuses, the one or more sensors comprise a temperature sensor, a humidity sensor, an air quality sensor, an accelerometer, or any combination thereof.

Another apparatus is described. The apparatus may include a wearable ring device configured to be worn on a digit of a user, comprising, a circumferential housing, one or more sensors positioned at least partially within the circumferential housing, wherein the one or more sensors are configured to acquire physiological data associated with the user, a first inductive component positioned within the circumferential housing, a removable cover configured to engage the wearable ring device, the removable cover comprising, one or more electrical components positioned at least partially within the removable cover, and a second inductive component exposed to an external surface of the removable cover, the second inductive component configured to wirelessly communicate with the first inductive component of the wearable ring device when the removable cover is in a mounted state on the wearable ring device, wherein the second inductive component is further configured to transfer electrical current, data, or both, between the one or more electrical components of the removable cover and one or more sensors of the wearable ring device.

In some examples of the apparatuses, a locking mechanism configured to secure the removable cover to the wearable ring device in the mounted state, the locking mechanism comprising, a first locking component of the wearable ring device, and a second locking component of the removable cover, the second locking component configured to engage the first locking component of the wearable ring device to secure the removable cover to the wearable ring device in the mounted state.

In some examples of the apparatuses, the second locking component may be configured to engage with the first locking component to secure the removable cover to the wearable ring device in a defined orientation that enables the second inductive component to wirelessly communicate with the first inductive component.

In some examples of the apparatuses, the first locking component, the second locking component, or both, comprise a tab, a groove, a detent, a button, a magnet, or any combination thereof.

In some examples of the apparatuses, the first inductive component, the second inductive component, or both, comprise a transmitter coil, a receiver coil, ferrite tape, or any combination thereof.

In some examples of the apparatuses, the removable cover may include operations, features, means, or instructions for a wireless communication component that may be communicatively coupled to the one or more electrical components of the removable cover, wherein the wireless communication component may be configured to, receive data acquired by the one or more sensors of the wearable ring device, the one or more electrical components of the removable cover, or both, and transmit the data to a user device associated with the wearable ring device.

Some examples of the apparatuses may further include operations, features, means, or instructions for receive a first signal from the user device and transmit a second signal to the wearable ring device via the second inductive component based at least in part on receiving the first signal.

In some examples of the apparatuses, the wearable ring device may include operations, features, means, or instructions for a wireless communication component that may be communicatively coupled to the one or more sensors of the wearable ring device, wherein the wireless communication component may be configured to, receive data acquired by the one or more sensors of the wearable ring device, the one or more electrical components of the wearable ring device, or both, and transmit the data to a user device associated with the wearable ring device.

Some examples of the apparatuses may further include operations, features, means, or instructions for receive a first signal from the user device and transmit a second signal to the removable cover via the first inductive component based at least in part on receiving the first signal.

In some examples of the apparatuses, the removable cover comprises a ring-shaped housing that may be configured to at least partially surround the wearable ring device in the mounted state and the second inductive component may be positioned proximate to an inner circumferential surface of the ring-shaped housing.

In some examples of the apparatuses, the one or more electrical components of the removable cover comprise a battery and the second inductive component may be configured to transfer power from the battery to the one or more sensors of the wearable ring device.

In some examples of the apparatuses, the one or more electrical components of the removable cover comprise one or more additional sensors configured to acquire data and the one or more sensors comprise a temperature sensor, a humidity sensor, an air quality sensor, an accelerometer, or any combination thereof.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable ROM (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A removable cover for a wearable ring device, comprising:
   a ring-shaped cover housing configured to at least partially surround at least a portion of the wearable ring device when the ring-shaped cover housing is in a mounted state on the wearable ring device, wherein the removable cover does not include a dedicated power source for powering one or more sensors;
   one or more electrical components positioned at least partially within the ring-shaped cover housing, the one or more electrical components comprising the one or more sensors; and
   a first inductive component positioned within the ring-shaped cover housing, the first inductive component configured to wirelessly communicate with a second inductive component of the wearable ring device when the ring-shaped cover housing is in the mounted state on the wearable ring device, wherein the first inductive component is configured to:
      receive an electrical current from a battery of the wearable ring device based at least in part on the ring-shaped cover housing being in the mounted state;
      transfer the electrical current to the one or more sensors of the removable cover based at least in part on receiving the electrical current;
      receive a signal from the wearable ring device when the ring-shaped cover housing is in the mounted state;
      collect data using the one or more sensors of the removable cover based at least in part on receiving the signal and based at least in part on transferring the electrical current to the one or more sensors; and
      transmit the data collected by the one or more sensors to the wearable ring device via the first inductive component and the second inductive component.

2. The removable cover of claim 1, wherein the ring-shaped cover housing comprises:
   a first locking component configured to engage a second locking component of the wearable ring device to secure the ring-shaped cover housing to the wearable ring device in the mounted state, wherein the mounted state is configured to position the first inductive component of the removable cover within a threshold distance from the second inductive component of the wearable ring device, and wherein the first inductive component is configured to wirelessly communicate with the second inductive component based at least in part on being positioned within the threshold distance from the second inductive component.

3. The removable cover of claim 2, wherein the first locking component comprises a tab, a groove, a detent, a button, a magnet, or any combination thereof.

4. The removable cover of claim 1, wherein the first inductive component comprises a transmitter coil, a receiver coil, ferrite tape, or any combination thereof.

5. The removable cover of claim 1, further comprising a wireless communication component that is configured to:
   receive a first signal from a user device; and
   transmit a second signal from the removable cover to the wearable ring device via the first inductive component based at least in part on receiving the first signal.

6. The removable cover of claim 1, wherein an inner circumferential surface of the ring-shaped cover housing substantially confirms to an outer circumferential surface of the wearable ring device in the mounted state.

7. The removable cover of claim 1, wherein the one or more electrical components of the removable cover comprise a battery, and the first inductive component comprises an inductive charging component that is configured to transfer power from the battery to one or more additional electrical components of the wearable ring device.

8. The removable cover of claim 1, wherein the ring-shaped cover housing is configured to be inserted into a cavity of the wearable ring device such that the ring-shaped cover housing spans at least a portion of a circumference of the wearable ring device.

9. The removable cover of claim 8, wherein the ring-shaped cover housing is configured to substantially seal the cavity of the wearable ring device when the ring-shaped cover housing is in the mounted state.

10. A wearable device system, comprising:
a wearable ring device configured to be worn on a digit of a user, comprising:
a circumferential housing;
one or more sensors positioned at least partially within the circumferential housing, wherein the one or more sensors are configured to acquire physiological data associated with the user;
a first inductive component positioned within the circumferential housing; and
a removable cover configured to engage the wearable ring device, the removable cover comprising:
a ring-shaped cover housing configured to at least partially surround at least a portion of the circumferential housing of the wearable ring device when the ring-shaped cover housing is in a mounted state on the wearable ring device, wherein the removable cover does not include a dedicated power source for powering the one or more sensors;
one or more electrical components positioned at least partially within the ring-shaped cover housing, the one or more electrical components comprising one or more sensors; and
a second inductive component exposed to an external surface of the ring-shaped cover housing, the second inductive component configured to wirelessly communicate with the first inductive component of the wearable ring device when the removable cover is in a mounted state on the wearable ring device, wherein the second inductive component is configured to:
receive an electrical current from a battery of the wearable ring device based at least in part on the ring-shaped cover housing being in the mounted state;
transfer the electrical current to the one or more sensors of the removable cover based at least in part on receiving the electrical current;
receive a signal from the wearable ring device when the ring-shaped cover housing is in the mounted state;
collect data using the one or more sensors of the removable cover based at least in part on receiving the signal and based at least in part on transferring the electrical current to the one or more sensors; and
transmit the data collected by the one or more sensors to the wearable ring device via the first inductive component and the second inductive component.

11. The wearable device system of claim 10, further comprising:
a locking mechanism configured to secure the ring-shaped cover housing of the removable cover to the wearable ring device in the mounted state, the locking mechanism comprising:
a first locking component of the wearable ring device; and
a second locking component of the ring-shaped cover housing, the second locking component configured to engage the first locking component of the wearable ring device to secure the ring-shaped cover housing to the wearable ring device in the mounted state.

12. The wearable device system of claim 11, wherein the second locking component is configured to engage with the first locking component to secure the ring-shaped cover housing to the wearable ring device in a defined orientation that enables the second inductive component to wirelessly communicate with the first inductive component.

13. The wearable device system of claim 11, wherein the first locking component, the second locking component, or both, comprise a tab, a groove, a detent, a button, a magnet, or any combination thereof.

14. The wearable device system of claim 10, wherein the first inductive component, the second inductive component, or both, comprise a transmitter coil, a receiver coil, ferrite tape, or any combination thereof.

15. The wearable device system of claim 10, wherein the removable cover further comprises:
a wireless communication component that is communicatively coupled to the one or more electrical components of the removable cover, wherein the wireless communication component is configured to:
receive data acquired by the one or more sensors of the wearable ring device, the one or more electrical components of the removable cover, or both; and
transmit the data to a user device associated with the wearable ring device.

16. The wearable device system of claim 10, wherein the ring-shaped cover housing is configured to be inserted into a cavity of the wearable ring device such that the ring-shaped cover housing spans at least a portion of a circumference of the wearable ring device.

17. The wearable device system of claim 16, wherein the ring-shaped cover housing is configured to substantially seal the cavity of the wearable ring device when the ring-shaped cover housing is in the mounted state.

18. A removable cover for a wearable ring device, comprising:
a ring-shaped cover housing configured to at least partially surround at least a portion of the wearable ring device when the ring-shaped cover housing is in a mounted state on the wearable ring device, wherein an outer circumferential surface of the ring-shaped cover housing substantially confirms to an inner circumferential surface of the wearable ring device while in the mounted state;
one or more electrical components positioned at least partially within the ring-shaped cover housing, the one or more electrical components comprising one or more sensors; and
a first inductive component positioned within the ring-shaped cover housing, the first inductive component configured to wirelessly communicate with a second inductive component of the wearable ring device when the ring-shaped cover housing is in the mounted state on the wearable ring device, wherein the first inductive component is configured to:
receive a signal from the wearable ring device when the ring-shaped cover housing is in the mounted state;
collect data using the one or more sensors of the removable cover based at least in part on receiving the signal; and
transmit the data collected by the one or more sensors to the wearable ring device via the first inductive component and the second inductive component.

19. A wearable device system, comprising:
a wearable ring device configured to be worn on a digit of a user, comprising:
   a circumferential housing;
   one or more sensors positioned at least partially within the circumferential housing, wherein the one or more sensors are configured to acquire physiological data associated with the user;
   a first inductive component positioned within the circumferential housing; and
   a removable cover configured to engage the wearable ring device, the removable cover comprising:
      a ring-shaped cover housing configured to at least partially surround at least a portion of the circumferential housing of the wearable ring device when the ring-shaped cover housing is in a mounted state on the wearable ring device, wherein an outer circumferential surface of the ring-shaped cover housing substantially confirms to an inner circumferential surface of the wearable ring device while in the mounted state;
      one or more electrical components positioned at least partially within the ring-shaped cover housing, the one or more electrical components comprising one or more sensors; and
      a second inductive component exposed to an external surface of the ring-shaped cover housing, the second inductive component configured to wirelessly communicate with the first inductive component of the wearable ring device when the removable cover is in a mounted state on the wearable ring device, wherein the second inductive component is configured to:
         receive a signal from the wearable ring device when the ring-shaped cover housing is in the mounted state;
         collect data using the one or more sensors of the removable cover based at least in part on receiving the signal; and
         transmit the data collected by the one or more sensors to the wearable ring device via the first inductive component and the second inductive component.

\* \* \* \* \*